United States Patent
Rogers et al.

(10) Patent No.: US 10,484,211 B2
(45) Date of Patent: Nov. 19, 2019

(54) MULTIPATH BANDPASS FILTERS WITH PASSBAND NOTCHES

(71) Applicant: SKYWORKS SOLUTIONS, INC., Woburn, MA (US)

(72) Inventors: John William Mitchell Rogers, Nepean (CA); Alexander John Heaslip Ross, Portland (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/906,155

(22) Filed: Feb. 27, 2018

(65) Prior Publication Data

US 2018/0278442 A1 Sep. 27, 2018

Related U.S. Application Data

(60) Provisional application No. 62/468,546, filed on Mar. 8, 2017.

(51) Int. Cl.
*H04L 25/03* (2006.01)
*H04B 1/10* (2006.01)

(52) U.S. Cl.
CPC ......... *H04L 25/03828* (2013.01); *H04B 1/10* (2013.01)

(58) Field of Classification Search
CPC ............................................. H04L 25/03828
USPC ........................................................ 375/232
See application file for complete search history.

(56) References Cited

U.S. PATENT DOCUMENTS

| 8,219,059 | B2 | 7/2012 | Pera et al. | |
|---|---|---|---|---|
| 9,294,138 | B2 | 3/2016 | Su et al. | |
| 9,407,482 | B2 | 8/2016 | Aggarwal et al. | |
| 9,991,914 | B1 | 6/2018 | Lee et al. | |
| 2009/0231170 | A1* | 9/2009 | Jung ................... | H04B 1/0003 341/61 |
| 2009/0233568 | A1* | 9/2009 | Zhang .................. | H04B 1/525 455/296 |
| 2014/0232468 | A1 | 8/2014 | Hulbert | |

(Continued)

OTHER PUBLICATIONS

Chun et al., "Switchable Embedded Notch Structure for UWB Bandpass Filter" IEEE Microwave and Wireless Components Letters, vol. 18, No. 9, Sep. 2008, in 3 pages.

(Continued)

*Primary Examiner* — Kevin M Burd
(74) *Attorney, Agent, or Firm* — Knobbe Martens Olson & Bear LLP

(57) ABSTRACT

Apparatus and methods related to multipath bandpass filters with passband notches are provided herein. In certain configurations, a multipath bandpass filter includes multiple filter circuit branches or paths that are electrically connected in parallel with one another between an input terminal and an output terminal. The input terminal receives an input signal, and each filter circuit branch includes a downconverter that downconverts the input signal to generate a downconverted signal, a filter network that generates a filtered signal by filtering the downconverted signal, and an upconverter that upconverts the filtered signal to generate a branch output signal. The filter network includes at least one low pass filter and at least one notch filter to provide a passband with in-band notches. The branch output signals from the filter circuit branches are combined to generate an output signal at the output terminal.

20 Claims, 15 Drawing Sheets

(56) References Cited

U.S. PATENT DOCUMENTS

2016/0218673 A1 7/2016 Anderson et al.
2016/0322996 A1 11/2016 Jabbour et al.
2018/0278441 A1 9/2018 Ross et al.

OTHER PUBLICATIONS

Galpin, R.K.P., "Narrow-Bandpass Filtering with Modulation" Electronics Letters, The Institute of Electronics Engineers, vol. 4, No. 9, May 3, 1968, in 2 pages.
Ghaffari et al., "A Differential 4-Path Highly Linear Widely Tunable On-Chip Band-Pass Filter" Radio Frequency Integrated Circuits Symposium, IEEE 2010, in 4 pages.
Lepage et al., "Analysis of a Comb Filter Using Synchronously Commutated Capacitors" Mar. 1953, in 6 pages.
Pelliccia et al., "Compact Ultra-Wideband Planar Filter with RF-MEMS-Based Tunable Notched Band" Proceedings of APMC 2012, Kaohsiung, Taiwan, Dec. 4-7, 2012, in 3 pages.
Rabbi et al. "Compact UWB Bandpass Filter with Reconfigurable Notched Band" Electronics Letters, May 2013, 2 pages.
Wang et al., "A UWB Filter with Tunable Notch Using Microstrip/Slotline Structure with T-Slot Stub" IEEE 2016, in 3 pages.

* cited by examiner

MULTIPATH BANDPASS FILTERS WITH PASSBAND NOTCHES

CROSS-REFERENCE TO RELATED APPLICATIONS

This application claims the benefit of priority under 35 U.S.C. § 119 of U.S. Provisional Patent Application No. 62/468,546, filed Mar. 8, 2017 and titled "MULTIPATH BANDPASS FILTERS WITH PASSBAND NOTCHES," which is herein incorporated by reference in its entirety.

BACKGROUND

Field

Embodiments of the invention relate to electronic systems, and in particular, to radio frequency (RF) electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 450 MHz to about 6 GHz for certain communications standards.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a multipath bandpass filter including an input terminal configured to receive an input signal, an output terminal, and a plurality of filter circuit branches electrically connected in parallel between the input terminal and the output terminal. Each of the filter circuit branches includes a downconverter configured to generate a downconverted signal by downconverting the input signal, a filter network including at least one low pass filter and at least one notch filter configured to filter the downconverted signal to generate a filtered signal, and an upconverter configured to upconvert the filtered signal to generate an upconverted filtered signal. Each upconverter having a respective output connected to the output terminal such that each respective upconverted filtered signal is combined at the output terminal to thereby generate a bandpass signal with passband notches.

In some embodiments, a plurality of time instances at which the plurality of filter circuit branches downconvert the input signal are staggered in time.

In a number of embodiments, the multipath filter further includes a clock generation circuit configured to control the plurality of filter circuit branches with a plurality of clock signal phases of a common clock signal frequency but of different phases, the multipath bandpass filter having a center frequency about equal to the common clock signal frequency.

In various embodiments, the at least one notch filter is configurable to control a location in frequency of the passband notches.

In several embodiments, the downconverter is configured to receive a first clock signal phase and the upconverter is configured to receive a second clock signal phase that is offset from the first clock signal phase. According to some embodiments, the plurality of filter circuit branches are an integer N in number, and the first clock signal phase and the second clock signal phase are separated in phase by about 360°/N.

In a number of embodiments, the downconverter is a double-in double-switched downconverter configured to downconvert the input signal with a pair of clock signals of a common clock signal frequency but of different phases. According to various embodiments, the multipath bandpass filter has a center frequency about equal to one-half of a product of a number of the plurality of filter circuit branches and the common clock signal frequency.

In some embodiments, the plurality of filter circuit branches includes at least four filter circuit branches.

In certain embodiments, the present disclosure relates to a packaged module. The packaged module includes a package substrate, and a semiconductor die attached to the package substrate. The semiconductor die has a plurality of circuit branches formed therein, and the plurality of circuit branches are electrically connected in parallel between an input node that receives an input signal and an output node. Each of the plurality of filter circuit branches includes a downconverter configured to generate a downconverted signal by downconverting the input signal, a filter network including at least one low pass filter and at least one notch filter configured to filter the downconverted signal to generate a filtered signal, and an upconverter configured to upconvert the filtered signal to generate an upconverted filtered signal, each upconverter having a respective output connected to the output node such that each respective upconverted filtered signal is combined at the output node to thereby generate a bandpass signal with passband notches.

In some embodiments, a plurality of time instances at which the plurality of filter circuit branches downconvert the input signal are staggered in time.

In various embodiments, the packaged module includes a clock generation circuit configured to control the plurality of filter circuit branches with a plurality of clock signal phases of a common clock signal frequency but of different phases, the multipath bandpass filter having a center frequency about equal to the common clock signal frequency.

In several embodiments, the at least one notch filter is configurable to control a location in frequency of the passband notches.

In a number of embodiments, the downconverter is configured to receive a first clock signal phase and the upconverter is configured to receive a second clock signal phase that is offset from the first clock signal phase.

In various embodiments, the downconverter is a double-in double-switched downconverter configured to downconvert the input signal with a pair of clock signals of a common clock signal frequency but of different phases.

In certain embodiments, the present disclosure relates to a mobile device. The mobile device includes an antenna, and a front-end module electrically coupled to the antenna. The front-end module includes an input terminal configured to receive an input signal from the antenna, an output terminal configured to provide a bandpass filtered signal with notches, and a plurality of filter circuit branches electrically connected in parallel between the input terminal and the output terminal. Each of the plurality of filter circuit branches includes a downconverter configured to generate a downconverted signal by downconverting the input signal, a filter network including at least one low pass filter and at least one notch filter configured to filter the downconverted signal to generate a filtered signal, and an upconverter configured to upconvert the filtered signal to generate an upconverted filtered signal. Each upconverter having a respective output connected to the output terminal such that each respective upconverted filtered signal is combined at the output terminal to thereby generate a bandpass signal with passband notches.

In various embodiments, a plurality of time instances at which the plurality of filter circuit branches downconvert the input signal are staggered in time.

In a number of embodiments, the filter network is configurable to control a frequency response of the multipath bandpass filter.

In several embodiments, the at least one notch filter is configurable to control a location in frequency of the passband notches.

In some embodiments, the downconverter is configured to receive a first clock signal phase and the upconverter is configured to receive a second clock signal phase that is offset from the first clock signal phase.

In certain embodiments, the present disclosure relates to multipath bandpass filter including an input terminal configured to receive an input signal, an output terminal, and a plurality of filter paths electrically connected in parallel between the input terminal and the output terminal. Each of the plurality of filter paths including a downconverter configured to generate a downconverted signal by downconverting the input signal, a filter network including at least one low pass filter and at least one notch filter configured to filter the downconverted signal to generate a filtered signal, and an upconverter configured to upconvert the filtered signal, the at least one notch filter operable to provide the multipath bandpass filter with passband notches.

In various embodiments, a plurality of time instances at which the plurality of filter paths downconvert the input signal are staggered in time.

In several embodiments, the multipath bandpass filter further includes a clock generation circuit configured to generate a plurality of clock signal phases of a common clock signal frequency but of different phases, the plurality of clock signal phases operable to control the plurality of filter paths. According to some embodiments, the multipath bandpass filter has a center frequency about equal to the common clock signal frequency.

In a number of embodiments, the filter network is configurable to control a frequency response of the multipath bandpass filter.

In various embodiments, the at least one notch filter is configurable to control a location in frequency of the passband notches.

In some embodiments, the at least one notch filter includes two or more notch filters.

In several embodiments, the downconverter is configured to receive a first clock signal phase and the upconverter is configured to receive a second clock signal path that is offset from the first clock signal phase. According to a number of embodiments, the plurality of filter paths are an integer N in number, and the first clock signal phase and the second clock signal phase are separated in phase by about 360°/N.

In various embodiments, the downconverter is a double-in double-switched downconverter configured to downconvert the input signal with a pair of clock signals of a common clock signal frequency but of different phases. According to some embodiments, the multipath bandpass filter has a center frequency about equal to one-half of a product of a number of the plurality of filter paths and the common clock signal frequency. In accordance with several embodiments, the plurality of filter paths are an integer N in number, and the pair of clock signals of each of the plurality of filter paths is separated in phase by about 720°/N. According to a number of embodiments, the pair of clock signals for a filter path k of the plurality of filter paths includes a first clock signal with a phase of about 360° (k−1)/N and a second clock signal with a phase of about 360°(k+1)/N. In accordance with some embodiments, the clock signal of the upconverter has a phase that is about half way between a first phase and a second phase of the pair of clocks signals. According to several embodiments, the plurality of filter paths includes an even number of at least four filter paths.

In a number of embodiments, the plurality of filter paths includes at least three filter paths.

In certain embodiments, the present disclosure relates to a packaged module. The packaged module includes a package substrate, and a semiconductor die attached to the package substrate. The semiconductor die includes a multipath bandpass filter including an input terminal configured to receive an input signal, an output terminal, and a plurality of filter paths electrically connected in parallel between the input terminal and the output terminal, each of the plurality of filter paths including a downconverter configured to generate a downconverted signal by downconverting the input signal, a filter network including at least one low pass filter and at least one notch filter configured to filter the downconverted signal to generate a filtered signal, and an upconverter configured to upconvert the filtered signal. The at least one notch filter is operable to provide the multipath bandpass filter with passband notches.

In various embodiments, a plurality of time instances at which the plurality of filter paths downconvert the input signal are staggered in time.

In several embodiments, the packaged module further includes a clock generation circuit configured to generate a plurality of clock signal phases of a common clock signal frequency but of different phases, the plurality of clock signal phases operable to control the plurality of filter paths. According to a number of embodiments, the multipath bandpass filter has a center frequency about equal to the common clock signal frequency. In accordance with some embodiments, the filter network is configurable to control a frequency response of the multipath bandpass filter.

In some embodiments, the at least one notch filter is configurable to control a location in frequency of the passband notches.

In various embodiments, the at least one notch filter includes two or more notch filters.

In some embodiments, the downconverter is configured to receive a first clock signal phase and the upconverter is configured to receive a second clock signal path that is offset from the first clock signal phase. According to several embodiments, the plurality of filter paths are an integer N in number, the first clock signal phase and the second clock signal phase separated in phase by about 360°/N. In accordance with various embodiments, the downconverter is a double-in double-switched downconverter configured to downconvert the input signal with a pair of clock signals of a common clock signal frequency but of different phases. According to a number of embodiments, the multipath bandpass filter has a center frequency about equal to one-half of a product of a number of the plurality of filter paths and the common clock signal frequency. In accordance with several embodiments, the plurality of filter paths are an integer N in number, and the pair of clock signals of each of the plurality of filter paths are separated in phase by about 720°/N. According to various embodiments, the pair of clock signals for a filter path k of the plurality of filter paths includes a first clock signal with a phase of about 360°(k−1)/N and a second clock signal with a phase of about 360°(k+1)/N. In accordance with a number of embodiments, the clock signal of the upconverter has a phase that is about half way between the phases of the pair of clocks signals. According to several embodiments, the plurality of filter paths includes an even number of at least four filter paths.

In various embodiments, the plurality of filter paths includes at least three filter paths.

In certain embodiments, the present disclosure relates to a mobile device. The mobile device includes an antenna, and a front-end module electrically coupled to the antenna. The front-end module includes an input terminal configured to receive an input signal from the antenna, an output terminal configured to provide a bandpass filtered signal with notches, and a plurality of filter paths electrically connected in parallel between the input terminal and the output terminal. Each of the plurality of filter paths includes a downconverter configured to generate a downconverted signal by downconverting the input signal, a filter network including at least one low pass filter and at least one notch filter configured to filter the downconverted signal to generate a filtered signal, and an upconverter configured to upconvert the filtered signal. The at least one notch filter operable to provide the multipath bandpass filter with passband notches.

In various embodiments, a plurality of time instances at which the plurality of filter paths downconvert the input signal are staggered in time.

In a number of embodiments, the mobile device further includes a clock generation circuit configured to generate a plurality of clock signal phases of a common clock signal frequency but of different phases, the plurality of clock signal phases operable to control the plurality of filter paths. According to several embodiments, the multipath bandpass filter has a center frequency about equal to the common clock signal frequency.

In various embodiments, the filter network is configurable to control a frequency response of the multipath bandpass filter.

In some embodiments, the at least one notch filter is configurable to control a location in frequency of the passband notches.

In a number of embodiments, the at least one notch filter includes two or more notch filters.

In various embodiments, the downconverter is configured to receive a first clock signal phase and the upconverter is configured to receive a second clock signal path that is offset from the first clock signal phase. According to several embodiments, the plurality of filter paths are an integer N in number, and the first clock signal phase and the second clock signal phase are separated in phase by about 360°/N.

In some embodiments, the downconverter is a double-in double-switched downconverter configured to downconvert the input signal with a pair of clock signals of a common clock signal frequency but of different phases. According to several embodiments, the multipath bandpass filter has a center frequency about equal to one-half of a product of a number of the plurality of filter paths and the common clock signal frequency. In accordance with a number of embodiments, the plurality of filter paths are an integer N in number, and the pair of clock signals of each of the plurality of filter paths is separated in phase by about 720°/N. According to various embodiments, the pair of clock signals for a filter path k of the plurality of filter paths includes a first clock signal with a phase of about 360°(k−1)/N and a second clock signal with a phase of about 360°(k+1)/N. In accordance with several embodiments, the clock signal of the upconverter has a phase that is about half way between the phases of the pair of clocks signals. According to several embodiments, the plurality of filter paths includes an even number of at least four filter paths.

In various embodiments, the plurality of filter paths includes at least three filter paths.

In certain embodiments, the present disclosure relates to a multipath bandpass filter including an input terminal configured to receive a radio frequency signal, an output terminal, and a plurality of filter paths electrically connected in parallel between the input terminal and the output terminal and operable to filter the radio frequency signal. The plurality of filter paths includes a first filter path including a first downconverter, a first filter network, and a first upconverter, and a second filter path including a second downconverter, a second filter network, and a second upconverter. The first filter network includes a first low pass filter and a first notch filter, and the second filter network includes a second low pass filter and a second notch filter. The multipath bandpass filter further includes a clock generation circuit configured to generate a plurality of clock signal phases of a common clock signal frequency but of different phases, the plurality of clock signal phases operable to control the plurality of filter paths.

In several embodiments, a plurality of time instances at which the plurality of filter paths downconvert the radio frequency signal are staggered in time.

In various embodiments, the multipath bandpass filter has a center frequency about equal to the common clock signal frequency.

In a number of embodiments, the first filter network and the second filter network are configurable to control a frequency response of the multipath bandpass filter.

In some embodiments, the first notch filter and the second notch filter are configurable to control a location in frequency of the passband notches.

In a number of embodiments, the first notch filter and the second notch filter provide a notch in a passband of the multipath bandpass filter at about the same frequency as one another.

In several embodiments, the first notch filter provides a first notch in a passband of the multipath bandpass filter and the second notch filter provides a second notch in the passband of the multipath bandpass filter, and the first notch and the second notch are at different frequencies.

In various embodiments, the first downconverter is configured to receive a first clock signal phase and the first upconverter is configured to receive a second clock signal path that is offset from the first clock signal phase. According to several embodiments, the first clock signal phase and the second clock signal phase are separated in phase by about 360° divided by a number of the plurality of filter paths.

In some embodiments, the first downconverter is a first double-in double-switched downconverter and the second downconverter is a second double-in double-switching downconverter. According to several embodiments, the multipath bandpass filter has a center frequency about equal to one-half of a product of a number of the plurality of filter paths and the common clock signal frequency. In accordance with a number of embodiments, the plurality of filter paths are an integer N in number, and the clock generation circuit is operable to provide a filter path k of the N filter paths with a first downconversion clock signal with a phase of about 360°(k−1)/N and a second downconversion clock signal with a phase of about 360°(k+1)/N.

In various embodiments, the plurality of filter paths further includes a third filter path including a third double-in double-switched downconverter, a third filter network, and a third upconverter. According to a number of embodiments, the plurality of filter paths further includes a fourth filter path including a fourth double-in double-switched downconverter, a fourth filter network, and a fourth upconverter.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
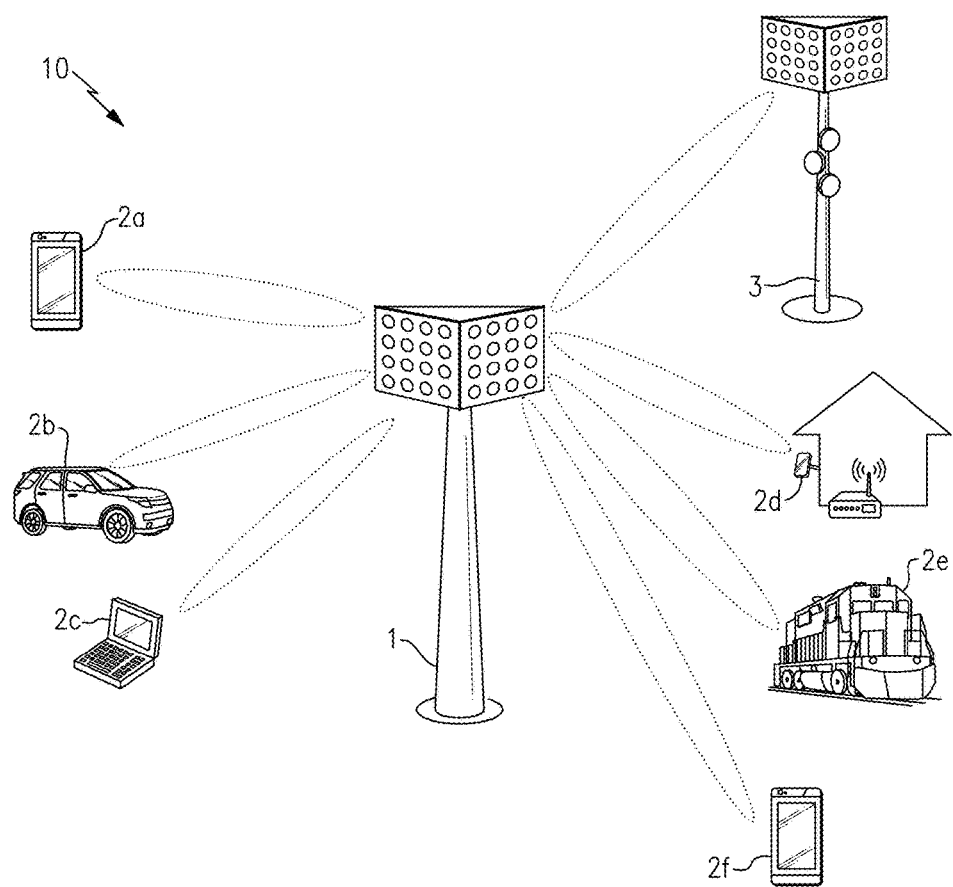
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP plans to introduce Phase 1 of fifth generation (5G) technology in Release 15 (targeted for 2018) and Phase 2 of 5G technology in Release 16 (targeted for 2019). Release 15 is anticipated to address 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
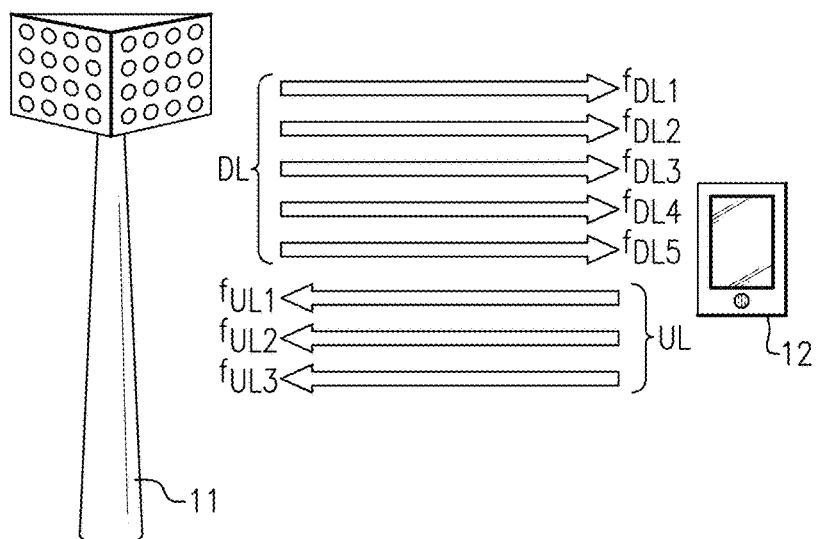
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 11 and a mobile device 12. As shown in FIG. 2A, the communications link includes a downlink channel used for RF communications from the base station 11 to the mobile device 12, and an uplink channel used for RF communications from the mobile device 12 to the base station 11.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 11 and the mobile device 12 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
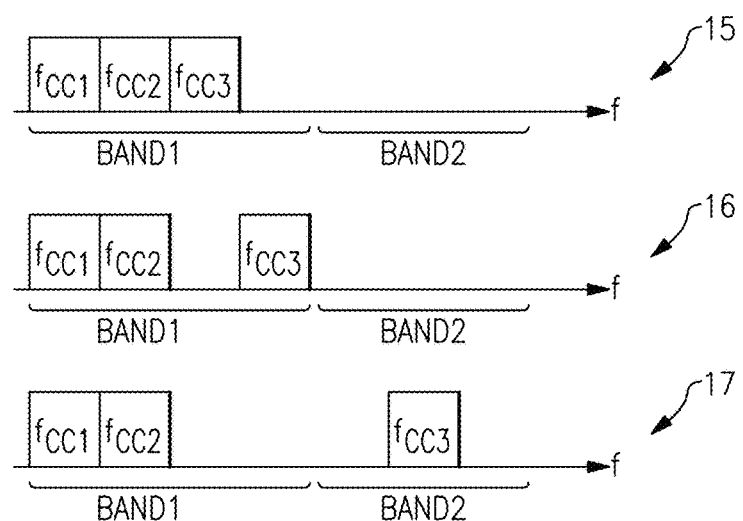
FIG. 2B illustrates various examples of carrier aggregation for the communication link of FIG. 2A.

FIG. 2B illustrates various examples of carrier aggregation for the communication link of FIG. 2A. FIG. 2B includes a first carrier aggregation scenario 15, a second carrier aggregation scenario 16, and a third carrier aggregation scenario 17, which schematically depict three types of carrier aggregation.

The carrier aggregation scenarios 15-17 illustrate different spectrum allocations for a first component carrier $f_{cc1}$, a second component carrier $f_{cc2}$, and a third component carrier $f_{cc3}$. Although FIG. 2B is illustrated in the context of aggregating three component carriers, carrier aggregation can be used to aggregate more or fewer carriers.

The first carrier aggregation scenario 15 illustrates intra-band contiguous carrier aggregation, in which component carriers that are adjacent in frequency and in a common frequency band are aggregated. For example, the first carrier aggregation scenario 15 depicts aggregation of component carriers $f_{cc1}$, $f_{cc2}$, and $f_{cc3}$ that are contiguous and located within a first frequency band BAND1.

With continuing reference to FIG. 2B, the second carrier aggregation scenario 16 illustrates intra-band non-continuous carrier aggregation, in which two or more components carriers that are non-adjacent in frequency and within a common frequency band are aggregated. For example, the second carrier aggregation scenario 16 depicts aggregation of component carriers $f_{cc1}$, $f_{cc2}$, and $f_{cc3}$ that are non-contiguous, but located within a first frequency band BAND1.

The third carrier aggregation scenario 17 illustrates inter-band non-contiguous carrier aggregation, in which component carriers that are non-adjacent in frequency and in multiple frequency bands are aggregated. For example, the third carrier aggregation scenario 17 depicts aggregation of component carriers $f_{cc1}$ and $f_{cc2}$ of a first frequency band BAND1 with component carrier $f_{cc3}$ of a second frequency band BAND2.

With reference to FIGS. 2A and 2B, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

Multipath Bandpass Filters with Passband Notches

Bandpass filters can be used to filter signals in radio frequency (RF) systems. For example, bandpass filters can be used to provide filtering of a wide variety of RF signals, including, but not limited to, wireless local area network (WLAN) signals, Bluetooth signals, and/or cellular signals. Bandpass filters can be used in a wide variety of electronic devices, including, but not limited to, smartphones, base stations, handsets, wearable electronics, and/or tablets.

One type of bandpass filter is a multipath bandpass filter, which is also referred to as an N-path bandpass filter.

Multipath bandpass filters with passband notches are provided herein. In certain configurations, a multipath bandpass filter includes multiple filter circuit branches or paths that are electrically connected in parallel with one another between an input terminal and an output terminal. The input terminal receives an input signal, and each filter circuit branch includes a downconverter that downconverts the input signal to generate a downconverted signal, a filter network that generates a filtered signal by filtering the downconverted signal, and an upconverter that upconverts the filtered signal to generate a branch output signal. The filter network includes at least one low pass filter and at least one notch filter to provide a passband with in-band notches. The branch output signals from the filter circuit branches are combined to generate an output signal at the output terminal.

Providing a bandpass filter with passband notches can provide a number of advantages. For example, a bandpass filter with passband notches can be used not only to attenuate out-of-band frequencies, but also to attenuate certain in-band frequency channels while passing other in-band frequency channels. For instance, in wideband and ultra-wideband transceiver architectures, a bandpass filter with passband notches can be used to remove in-band blockers and/or to support aggregation (see, for example, FIGS. 2A and 2B) by allowing removal of specific frequency channels of a band.

In certain implementations, the filter circuit branches are configurable such that the location in frequency of the passband and/or in-band notches can be controlled. For example, the clock signal frequency used for frequency conversion can be controlled to change a center frequency of the passband. Additionally, the filter network of a filter circuit branch can include variable components (for instance, tunable and/or programmable filter circuitry) used to control passband characteristics, such as bandwidth, corner frequency, and/or locations of in-band notches.

In such implementations, the component values of the filter networks can be selected in a wide variety of ways. In one example, the multipath bandpass filter can be fabricated on an IC or semiconductor chip that includes a serial interface, and data can be received over the interface (for instance, from a transceiver or RFIC) to control selected values of filter network components. By configuring the filter circuit branches, the frequency response of the multipath bandpass filter can be controlled to provide a desired location in frequency of the passband and/or in-band notches.

Thus, the teachings herein can be used to provide a versatile RF filter suitable for a wide variety of applications.

The multipath bandpass filters with in-band notches described herein can be fabricated using integrated circuit processes. Thus, in contrast to certain microstrip structures, the multipath bandpass filters provided herein can be fabricated on-chip. This in turn enhances integration, and allows one or more multipath bandpass filters to be formed on a common semiconductor chip with switches, amplifiers, and/or other RF circuitry. Furthermore, one or more multipath bandpass filters with in-band notches can be included in an RF system to reduce or eliminate a number of discrete filters, such as surface acoustic wave (SAW) filters and/or bulk acoustic wave (BAW) filters.

In certain implementations, each filter circuit branch includes a double-in double-switched (DIDS) downconverter that downconverts the input signal with two different clock signal phases to generate a downconverted signal. The DIDS downconverters operate with multiple clock signals of about the same frequency but different phases, and the clock signal frequency can be changed to control a center frequency of the multipath bandpass filter.

By using a DIDS downconverter in each filter circuit branch, the clock frequency corresponding to a given center frequency is relatively low. For example, in an implementation using N filter circuit branches, the clock frequency ($f_{CLK}$) corresponding to a particular center frequency ($f_{CENTER}$) can be about equal to $(2/N)*f_{CENTER}$. Thus, using DIDS downconverters relaxes timing constraints corresponding to a given center frequency, thereby facilitating implementation of the bandpass filter with reduced expense and/or complexity.

Additionally, using DIDS downconverters in the filter circuit branches aids in suppressing even order harmonics. Thus, a multipath bandpass filter with DIDS downconverters can be used to attenuate out-of-band frequencies, while maintaining signal quality of in-band frequencies. In contrast, a multipath bandpass filter that operates without DIDS downconverters can have a filter frequency response that includes additional selectivity at even and odd harmonics of the switching frequency.

Furthermore, such a filter's out-of-band frequency rejection is adversely affected by switching resistance, and the filter operates with a relatively high clock frequency to achieve a given center frequency. Accordingly, a multipath bandpass filter that operates without DIDS downconverters can have degraded harmonic performance, poor out-of-band rejection, and/or high cost and complexity.

Moreover, the multipath bandpass filters herein can exhibit improved out-of-band rejection even when switches used for frequency conversion have relatively high resistance.

Figure 3A:
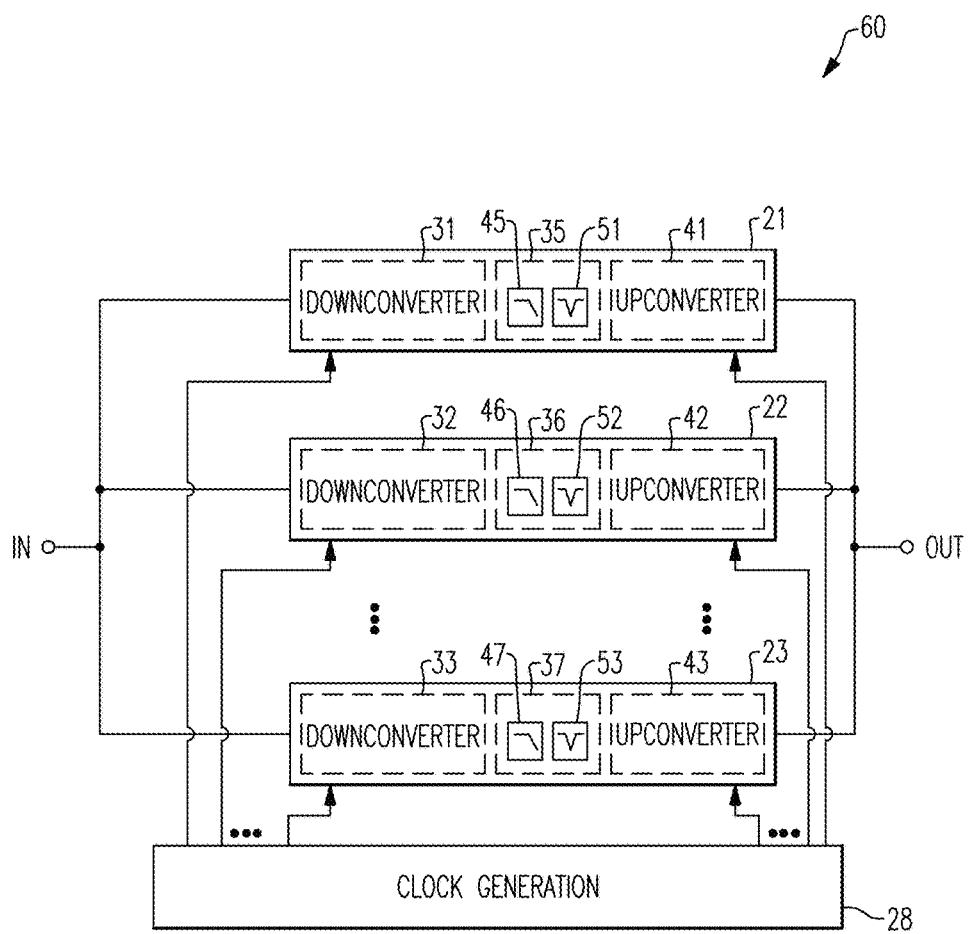
FIG. 3A is a schematic diagram of one embodiment of a multipath bandpass filter with passband notches.

FIG. 3A is a schematic diagram of one embodiment of a multipath bandpass filter 60 with passband notches. The multipath bandpass filter 60 includes a first filter circuit branch or path 21, a second filter circuit branch 22, a third filter circuit branch 23, and a clock generation circuit 28. As shown in FIG. 3A, the filter circuit branches 21-23 are electrically connected in parallel with one another between an input terminal IN and an output terminal OUT. A filter circuit branch is also referred to herein as a filter path.

Although an implementation of a multipath bandpass filter using three circuit branches is shown, the teachings herein are applicable to implementations using other numbers of filter circuit branches. In one embodiment, a multipath bandpass filter includes at least 2 filter circuit branches. In another embodiment, a multipath bandpass filter includes at least 3 filter circuit branches. In yet another embodiment, a multipath bandpass filter includes at least 4 filter circuit branches.

As shown in FIG. 3A, each of the filter circuit branches 21-23 includes a downconverter, a filter network, and an upconverter. For example, the first filter circuit branch 21 includes a first downconverter 31, a first filter network 35, and a first upconverter 41. Additionally, the second filter circuit branch 22 includes a second downconverter 32, a second filter network 36, and a second upconverter 42. Furthermore, the third filter circuit branch 23 includes a third downconverter 33, a third filter network 37, and a third upconverter 43.

With respect to each of the filter circuit branches 21-23, the branch's downconverter downconverts the input signal from the input terminal IN to generate a downconverted signal. Additionally, the branch's filter network operates to filter the downconverted signal to generate a filtered signal, which in turn is upconverted using the branch's upconverter to generate a branch output signal. Additionally, the branch output signals are combined to generate a bandpass signal with passband notches at the output terminal OUT. A branch output signal is also referred to herein as a path output signal.

The filter networks 35-37 are implemented to control a frequency response of the bandpass filter. In the illustrated embodiment, each of the filter networks 35-37 includes a low pass filter and a notch filter. For example, the first filter network 35 includes a first low pass filter 45 and a first notch filter 51. Additionally, the second filter network 36 includes a second low pass filter 46 and a second notch filter 52.

Furthermore, the third filter network 37 includes a third low pass filter 47 and a third notch filter 53.

Although FIG. 3A illustrated an embodiment in which each filter network includes one low pass filter and one notch filter, other implementations are possible, including, but not limited to, implementations in which a filter network includes multiple low pass filters and/or multiple notch filters.

In certain implementations, each of the filter networks 35-37 includes substantially identical circuitry. However, other implementations are possible. In one example, the notch filters 51-53 of the filter networks 35-37 can be implemented with different notch frequencies and/or different amounts of attenuation relative to one another to provide the multipath bandpass filter 60 with a desired overall frequency response.

In one embodiment, the low pass filters 45-47 each have a corner frequency $f_c$, and the notch filters 51-53 provide frequency notches that are in the passband.

Implementing the multipath bandpass filter 60 with in-band notches can provide a number of advantages. For example, the multipath bandpass filter 60 can be used to attenuate out-of-band frequencies and certain in-band frequency channels while passing other frequency channels of the band. For instance, the multipath bandpass filter 60 can be used to remove in-band blockers and/or to support aggregation by allowing removal or attenuation of specific frequency channels.

The low pass filters 45-47 and the notch filters 51-53 of the filter networks 35-37 can be implemented in a wide variety of ways, including but not limited to, using single order filters, higher order filters, passive filters, active filters, and/or switched capacitor filters.

In certain implementations, the filter networks 35-37 are configurable to provide control over a frequency response of the multipath bandpass filter 60. In one embodiment, at least one of a low pass filter or a notch filter of a filter network is configurable such that the location in frequency of the passband and/or the in-band notches can be controlled. In one example, the capacitance of a filter is variable (for instance, tunable and/or programmable) to control the filter's frequency response. In another example, the resistance of a filter is variable (for instance, tunable and/or programmable). In yet another example, the inductance of a filter is variable (for instance, tunable and/or programmable).

Each of the downconverters 31-33 provides downconversion using clock signals of about the same frequency ($f_{CLK}$), but different phases. For example, the downconversion clock signals are of different phases, such that the time instances at which the downconverters 31-33 downconvert the input signal are staggered in time. In one embodiment, a multipath bandpass filter includes N filter circuit branches, and a filter circuit branch k of the N filter circuit branches includes a downconverter that operates with a phase of about 360°(k−1)/N.

The upconverters 41-43 can also operate with a clock signal frequency of about $f_{CLK}$, but with different phases from one another. The clock phase of a given upconverter is offset in phase from the clock signal phases of a corresponding downconverter. Implementing a filter circuit branch in this manner aids in providing sufficient time for the node voltages of the filter circuit branch to settle (for instance, to provide sufficient time for capacitors to charge or discharge). In one embodiment, a multipath bandpass filter includes N filter circuit branches, and a filter circuit branch k of the N filter circuit branches includes an upconverter that operates with a phase of about 360°(k/N).

The clock generation circuit 28 can be implemented in a wide variety of ways, including, but not limited to, using digital circuitry (for instance, clock dividers), phase-locked loops (PLLs), multiphase oscillators, and/or polyphase filters. Although not illustrated in FIG. 3A, in certain implementations the clock generation circuit 28 receives a reference clock signal.

The multipath bandpass filter 60 has a bandpass center frequency ($f_{CENTER}$) that is controllable by changing the clock signal frequency ($f_{CLK}$). In the illustrated embodiment, the bandpass center frequency $f_{CENTER}$ is about equal to the clock signal frequency $f_{CLK}$. However, other implementations are possible. For example, as will be described below with reference to FIGS. 7 and 8, in other embodiments a DIDS downconverter is used in each filter circuit branch to provide a desired center frequency using a relatively slower clock signal frequency.

Figure 3B:
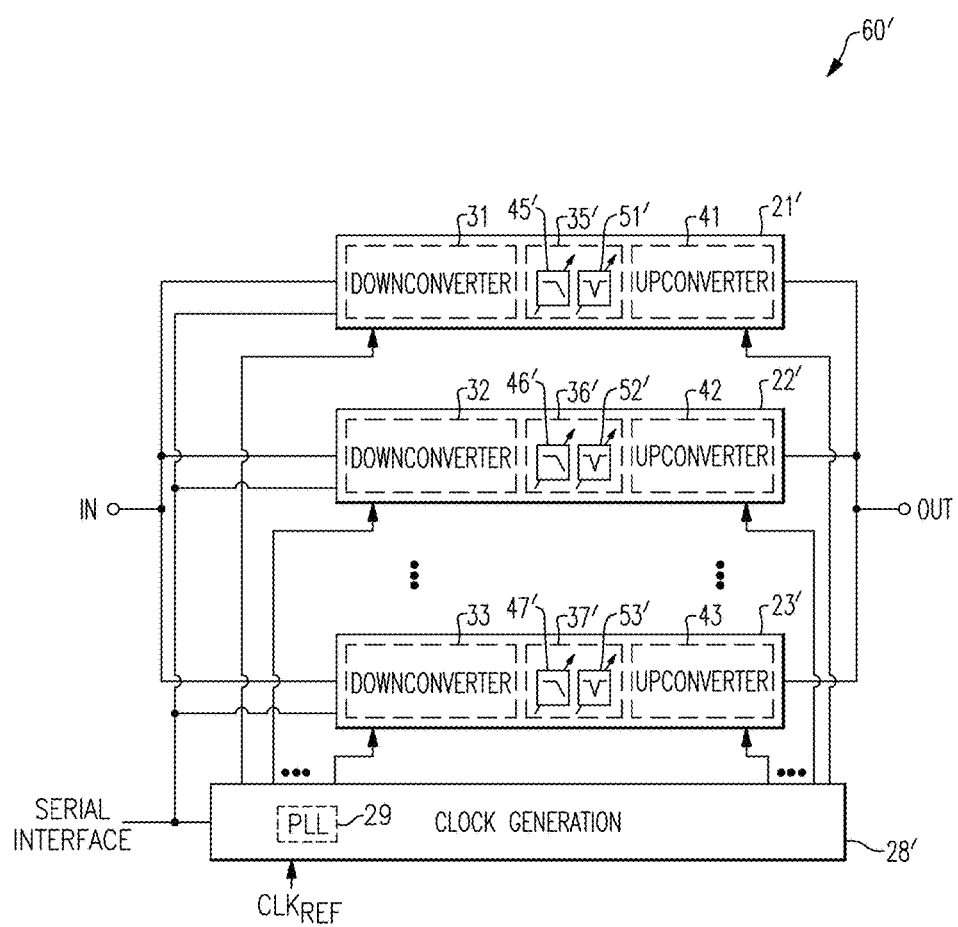
FIG. 3B is a schematic diagram of another embodiment of a multipath bandpass filter with passband notches.

FIG. 3B is a schematic diagram of another embodiment of a multipath bandpass filter 60' with passband notches. The multipath bandpass filter 60' includes a first filter circuit branch 21', a second filter circuit branch 22', a third filter circuit branch 23', and a clock generation circuit 28'. As shown in FIG. 3B, the filter circuit branches 21'-23' and the clock generation circuit 28' are connected to a serial interface, which can be used to provide data for controlling various filtering characteristics of the multipath bandpass filter 60'. In one embodiment, a transceiver or radio frequency integrated circuit (RFIC) controls data programmed over the serial interface.

The multipath bandpass filter 60' of FIG. 3B is similar to the multipath bandpass filter 60 of FIG. 3A, except that the multipath bandpass filter 60' is implemented with variable filter circuitry such that one or more of the filter's filtering characteristics are configurable. For example, the first filter circuit branch 21' includes a first downconverter 31, a first variable filter network 35', and a first upconverter 41. Additionally, the second filter circuit branch 22' includes a second downconverter 32, a second variable filter network 36', and a second upconverter 42. Furthermore, the third filter circuit branch 23' includes a third downconverter 33, a third variable filter network 37', and a third upconverter 43.

In certain implementations, the variable filter networks 35'-37' include one or more circuit components (for instance, resistors and/or capacitors) that are tunable and/or programmable to provide control over the frequency characteristics of the filter networks. In certain configurations, the variable filter networks 35'-37' are controllable by data received over the serial interface.

As shown in FIG. 3B, the clock generation circuit 28' includes a PLL 29, which can be used to generate the clock signals for controlling the filter circuit branches 21'-23'. In certain configurations, the output clock frequency of the PLL 29 is controlled by data received over the serial interface, thereby providing programmability of the center frequency of the passband of the multipath bandpass filter 60'. For instance, the data can control divisor values of a feedback divider of the PLL 29 to thereby control output clock frequency relative to a frequency of a reference clock signal $CLK_{REF}$.

The serial interface can be implemented in a wide variety of ways. In certain implementations, the serial interface corresponds to a mobile industry processor interface radio frequency front-end (MIPI RFFE) bus, an inter-integrated circuit ($I^2C$) bus, or any other suitable interface or bus.

Figure 4A:
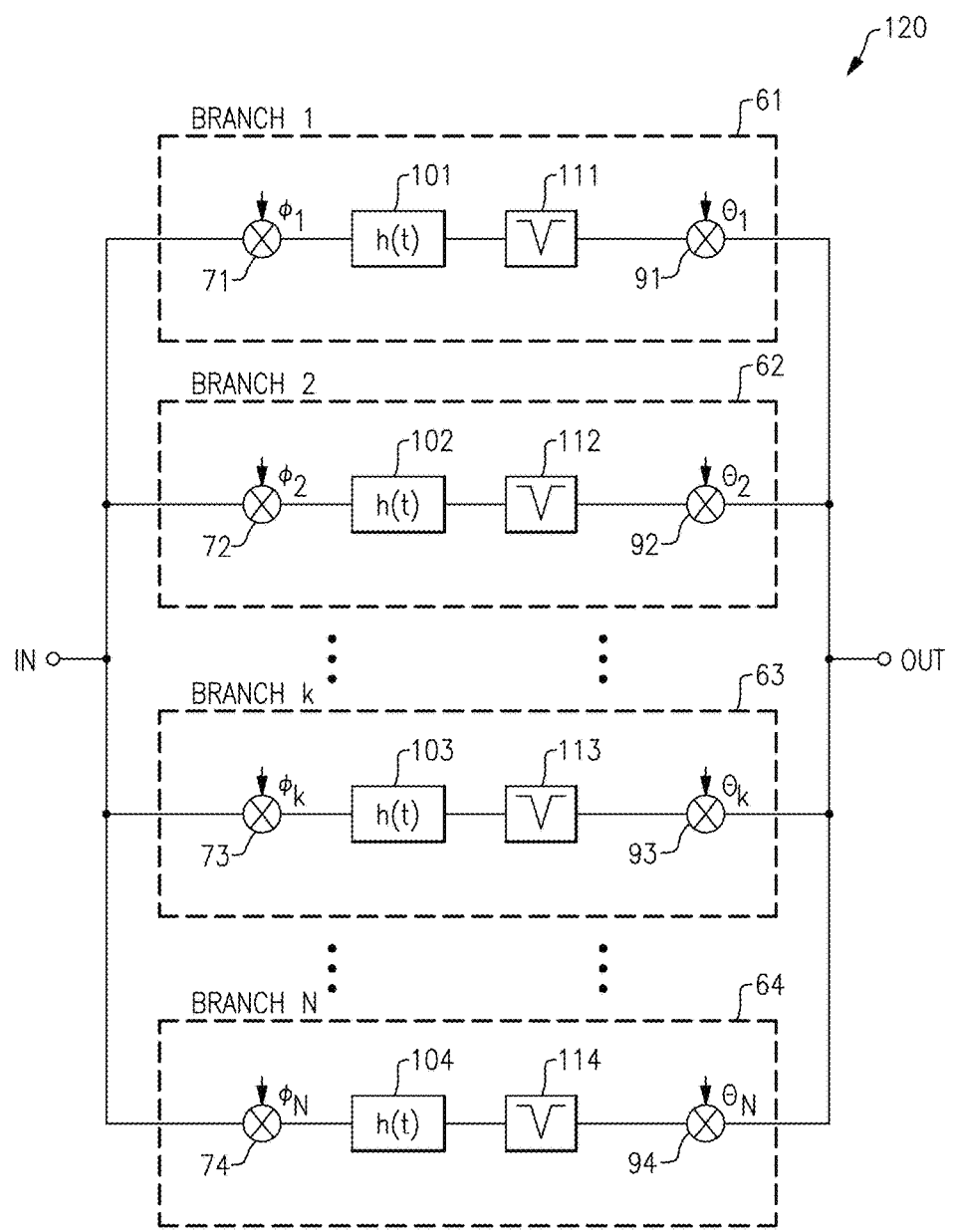
FIG. 4A is a schematic diagram of another embodiment of a multipath bandpass filter with passband notches.

FIG. 4A is a schematic diagram of another embodiment of a multipath bandpass filter 120 with passband notches. The multipath bandpass filter 120 includes a first filter circuit branch 61, a second filter circuit branch 62, a kth filter circuit branch 63, and an Nth filter circuit branch 64. The filter circuit branches 61-64 are electrically connected in parallel with one another between the input terminal IN and the output terminal OUT.

The first filter circuit branch 61 includes a first downconverting mixer 71 that operates with a clock signal phase $\phi_1$. Additionally, the first filter circuit branch 61 further includes a low pass filter 101 with a linear time invariant transfer function h(t) and a notch filter 111. Furthermore, the first filter circuit branch 61 further includes an upconverting mixer 91 that operates with clock signal phase $\theta_1$.

With continuing reference to FIG. 4A, the second filter circuit branch 62 includes a second downconverting mixer 72 that operates with clock signal phase $\phi_2$. Additionally, the second filter circuit branch 62 further includes a low pass filter 102 with transfer function h(t) and a notch filter 112. Furthermore, the second filter circuit branch 62 further includes an upconverting mixer 92 that operates with clock signal phase $\theta_2$.

The kth filter circuit branch 63 further includes a kth downconverting mixer 73 that operates with clock signal phase $\phi_k$. The kth filter circuit branch 63 further includes a low pass filter 103 with transfer function h(t) and a notch filter 113. Furthermore, the kth filter circuit branch 63 further includes an upconverting mixer 93 that operates with clock signal phase $\theta_k$.

With continuing reference to FIG. 4A, the Nth filter circuit branch 64 further includes an Nth downconverting mixer 74 that operates with clock signal phase $\phi_N$. The Nth filter circuit branch 64 further includes a low pass filter 104 with transfer function h(t) and a notch filter 114. Furthermore, the Nth filter circuit branch 64 further includes an upconverting mixer 94 that operates with clock signal phase $\theta_N$.

Figure 4B:
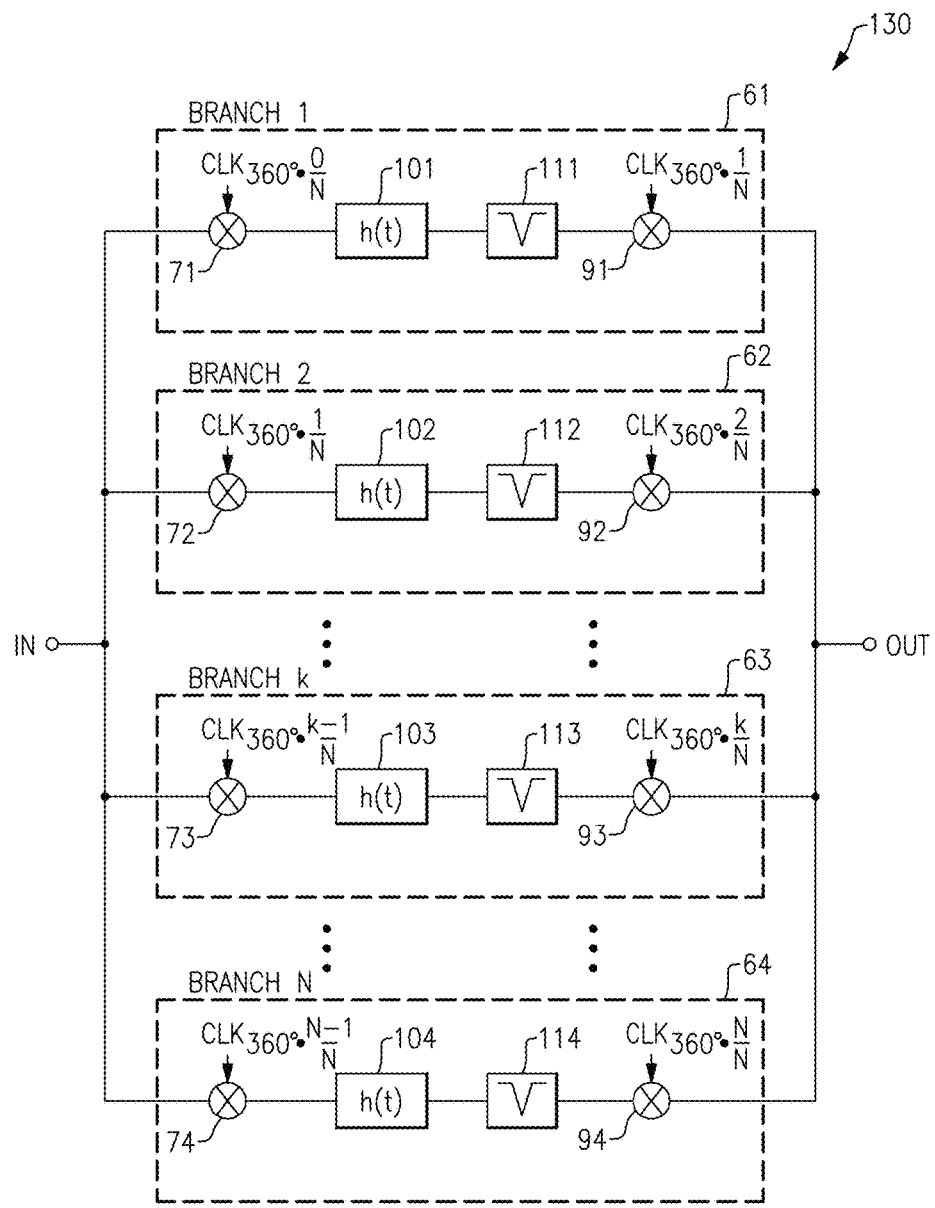
FIG. 4B is a schematic diagram of another embodiment of a multipath bandpass filter with passband notches.

FIG. 4B is a schematic diagram of another embodiment of a multipath bandpass filter 130 with passband notches. The multipath bandpass filter 130 of FIG. 4B is similar to the multipath bandpass filter 120 of FIG. 4A, except the multipath bandpass filter 130 illustrates specific clock signal phases for the mixers of the filter circuit branches 61-64.

In particular, the downconverting mixer 71 of the first filter circuit branch 61 operates with a clock signal phase 360°(0/N), and the upconverting mixer 91 of the first filter circuit branch 61 operates with a clock signal phase 360°(1/N). Additionally, the downconverting mixer 72 of the second filter circuit branch 62 operates with a clock signal phase 360°(1/N), and the upconverting mixer 92 of the second filter circuit branch 62 operates with a clock signal phase 360°(2/N). Furthermore, the downconverting mixer 73 of the kth filter circuit branch 63 operates with a clock signal phase 360°(k−1)/N, and the upconverting mixer 93 of the kth filter circuit branch 63 operates with a clock signal phase 360°(k/N). Additionally, the downconverting mixer 74 of the Nth filter circuit branch 64 operates with a clock signal phase 360°(N−1)/N, and the upconverting mixer 94 of the Nth filter circuit branch 64 operates with a clock signal phase 360°(N/N).

In the illustrated embodiment, the clock signal phases of a downconverting mixer and an upconverting mixer in a particular filter circuit branch are separated in phase by about 360°/N. Additionally, each filter circuit branch outputs a filtered signal over a time interval of $T_{CLK}/N$, where $T_{CLK}$ is the period of the clock signal. Furthermore, the clock signals of successive branches are offset by a phase difference of about 360°/N.

Although one example implementation of clock signal phases for upconverting mixers and downconverting mixers is illustrated in FIG. 4B, clock signal phases for mixers can be implemented in a wide variety of ways.

Figure 4C:
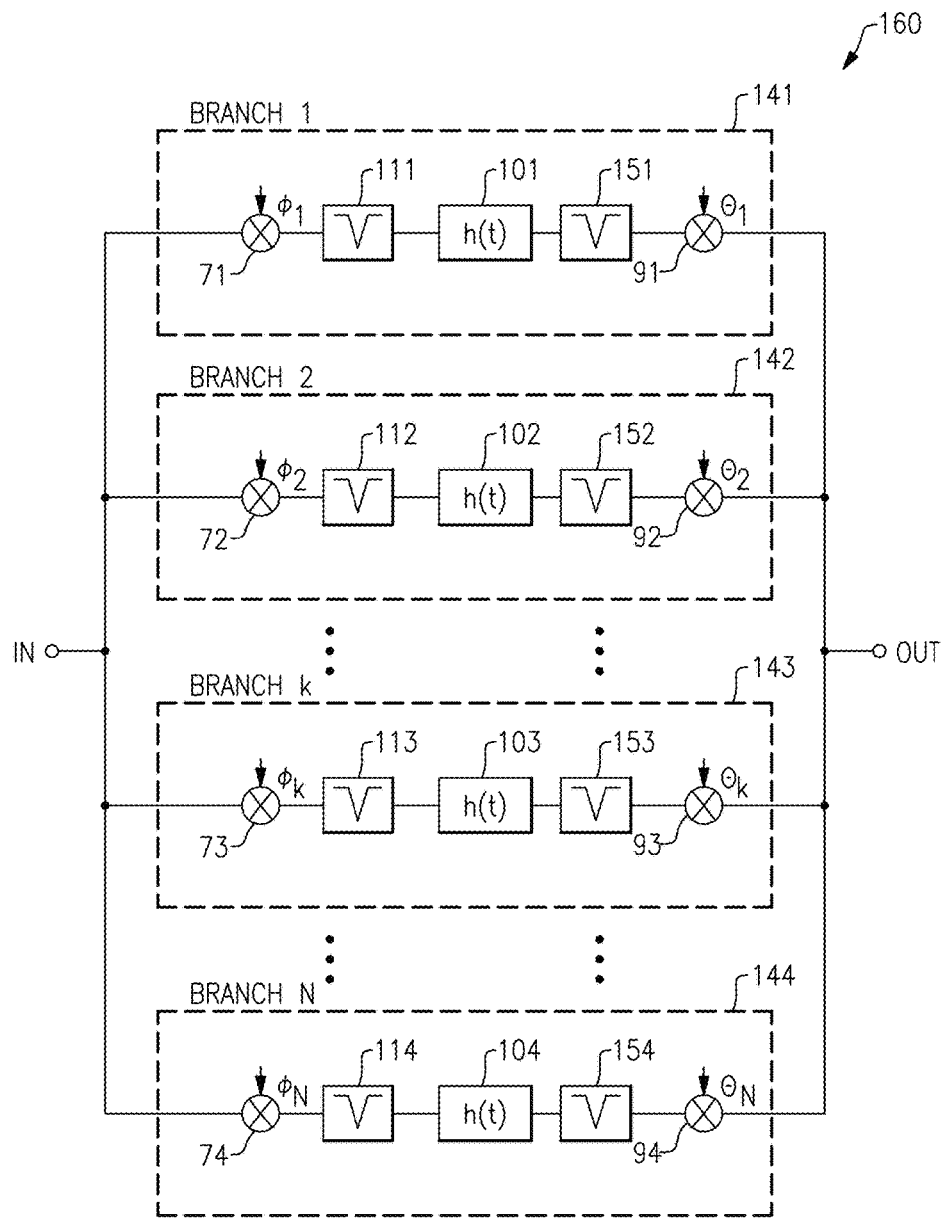
FIG. 4C is a schematic diagram of another embodiment of a multipath bandpass filter with passband notches.

FIG. 4C is a schematic diagram of another embodiment of a multipath bandpass filter 160. The multipath bandpass filter 160 of FIG. 4C is similar to the multipath bandpass filter 120 of FIG. 4A, except the multipath bandpass filter 160 includes a different implementation of filter networks in each filter circuit branch.

In particular the multipath bandpass filter 160 includes filter circuit branches 141-144 that each include a downconverting mixer, a first notch filter, a low pass filter, a second notch filter, and an upconverting mixer. For example, the first filter circuit branch 141 includes a cascade of a downconverting mixer 71, a first notch filter 111, a low pass filter 101, a second notch filter 151, and an upconverting mixer 91. Additionally, the second filter circuit branch 142 includes a cascade of a downconverting mixer 72, a first notch filter 112, a low pass filter 102, a second notch filter 152, and an upconverting mixer 92. Furthermore, the kth filter circuit branch 143 includes a cascade of a downconverting mixer 73, a first notch filter 113, a low pass filter 103, a second notch filter 153, and an upconverting mixer 93. Additionally, the Nth filter circuit branch 144 includes a cascade of a downconverting mixer 74, a first notch filter 114, a low pass filter 104, a second notch filter 154, and an upconverting mixer 94.

Filter networks of filter circuit branches can be implemented in a wide variety of ways, including, but not limited to, implementations using multiple notch filters. Although an example with two notch filters per branch is shown, the teachings herein are also applicable to filter circuit branches that include three or more notch filters per branch.

Figure 5A:
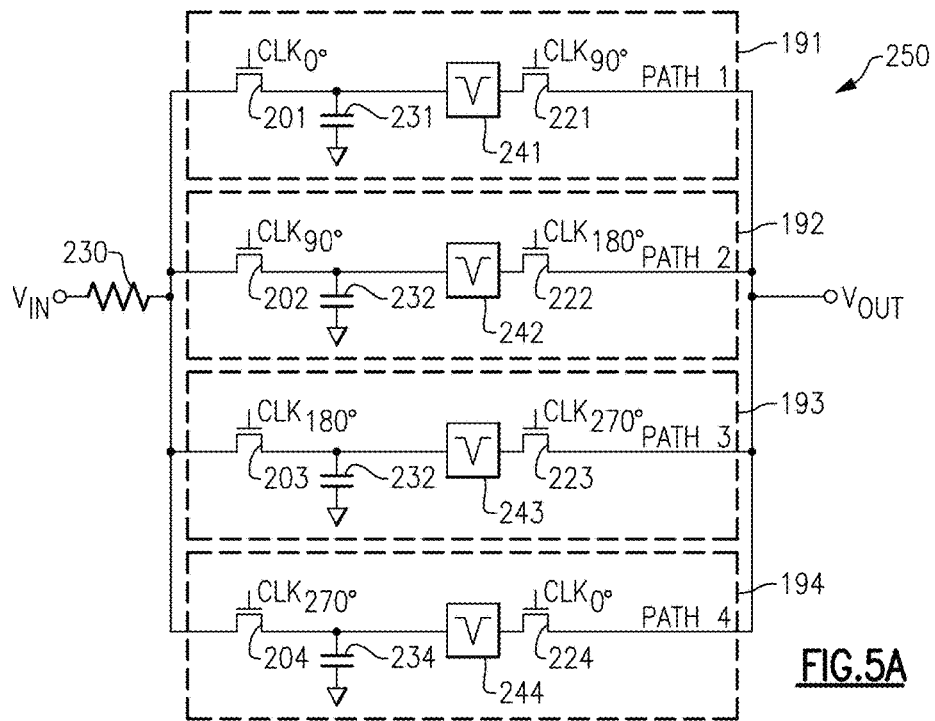
FIG. 5A is a circuit diagram of one embodiment of a multipath bandpass filter with passband notches.

FIG. 5A is a circuit diagram of one embodiment of a multipath bandpass filter 250 with passband notches. The multipath bandpass filter 250 includes a first filter circuit branch 191, a second filter circuit branch 192, a third filter circuit branch 193, a fourth filter circuit branch 194, and a shared input resistor 230. Each of the filter circuit branches 191-194 includes an input electrically connected to a voltage input terminal $V_{IN}$ via the shared input resistor 230. Additionally, each of the filter circuit branches 191-194 includes an output electrically connected to a voltage output terminal $V_{OUT}$.

Although an example with four filter circuit branches is shown, the teachings herein are applicable to multipath bandpass filters using more or fewer filter circuit branches. Additionally, although a specific implementation of filter path circuitry is shown, the teachings herein are applicable to filter circuit branches implemented in a wide variety of ways. Accordingly, other implementations are possible.

The first filter circuit branch 191 includes an input switch field-effect transistor (FET) 201 that receives a clock signal phase of about 0°, a shunt filter capacitor 231, a notch filter 241, and an output switch FET 221 that operates with a clock signal phase of about 90°. Additionally, the second filter circuit branch 192 includes an input switch FET 202 that receives a clock signal phase of about 90°, a shunt filter capacitor 232, a notch filter 242, and an output switch FET 222 that operates with a clock signal phase of about 180°. Furthermore, the third filter circuit branch 193 includes an input switch FET 203 that receives a clock signal phase of about 180°, a shunt filter capacitor 233, a notch filter 243, and an output switch FET 223 that operates with a clock signal phase of about 270°. Additionally, the fourth filter circuit branch 194 includes an input switch FET 204 that receives a clock signal phase of about 270°, a shunt filter capacitor 234, a notch filter 244, and an output switch FET 224 that operates with a clock signal phase of about 0°.

The illustrated multipath bandpass filter 250 includes filter networks that include a cascade of a first-order low pass filter and a notch filter. For example, each of the filter circuit branches 191-194 include a shunt capacitor that operates in combination with the shared input resistor 230 as a first-order low pass filter. Additionally, each of the filter circuit branches 191-194 includes a notch filter.

Sharing the input resistor 230 or other circuitry across paths or branches can reduce component count and/or path-to-path variation. However, other implementations are possible.

Figure 5B:
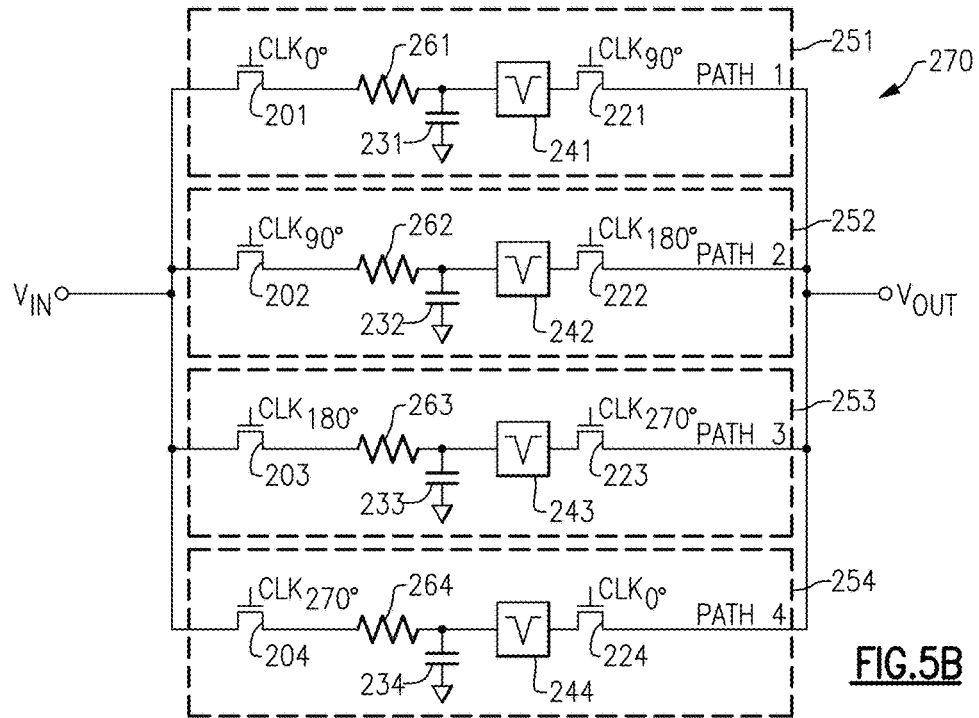
FIG. 5B is a circuit diagram of another embodiment of a multipath bandpass filter with passband notches.

FIG. 5B is a circuit diagram of another embodiment of a multipath bandpass filter 270 with passband notches. The multipath bandpass filter 270 of FIG. 5B is similar to the multipath bandpass filter 250 of FIG. 5A, except that the multipath bandpass filter 270 omits a shared input resistor in favor of using separate resistors in each filter circuit branch. For example, as shown in FIG. 5B, the filter circuit branches 251-254 include filter resistors 261-264, respectively.

Figure 5C:
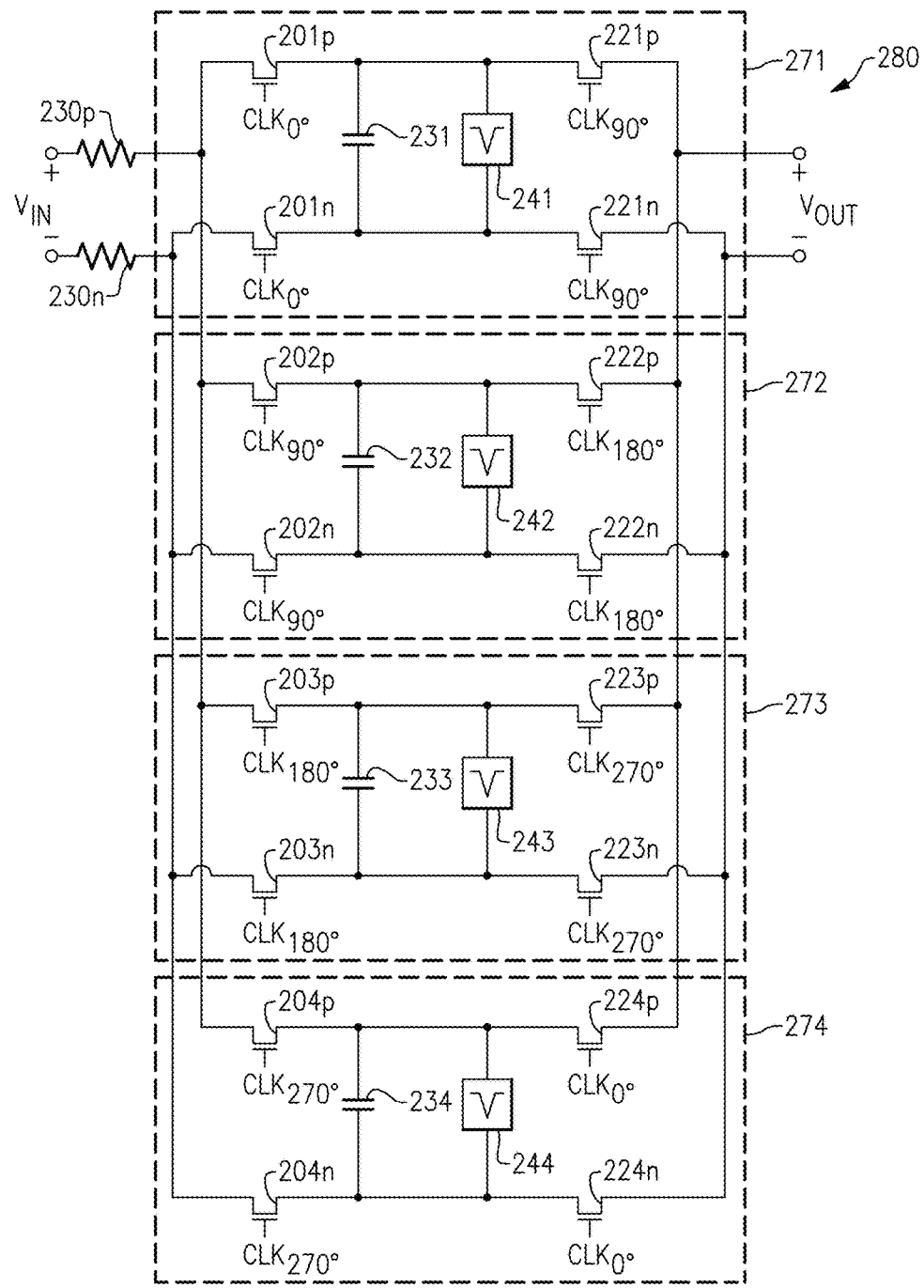
FIG. 5C is a circuit diagram of another embodiment of a multipath bandpass filter with passband notches.

FIG. 5C is a circuit diagram of another embodiment of a multipath bandpass filter 280 with passband notches. The multipath bandpass filter 280 of FIG. 5C is similar to the multipath bandpass filter 250 of FIG. 5A, except that the multipath bandpass filter 280 is implemented using differential filter circuit branches. For example, the multipath bandpass filter 280 includes first to fourth differential filter circuit branches 271-274, respectively.

Implementing a multipath bandpass filter using differential filter circuit branches can enhance performance with respect to suppressing even order harmonics.

Figure 6:
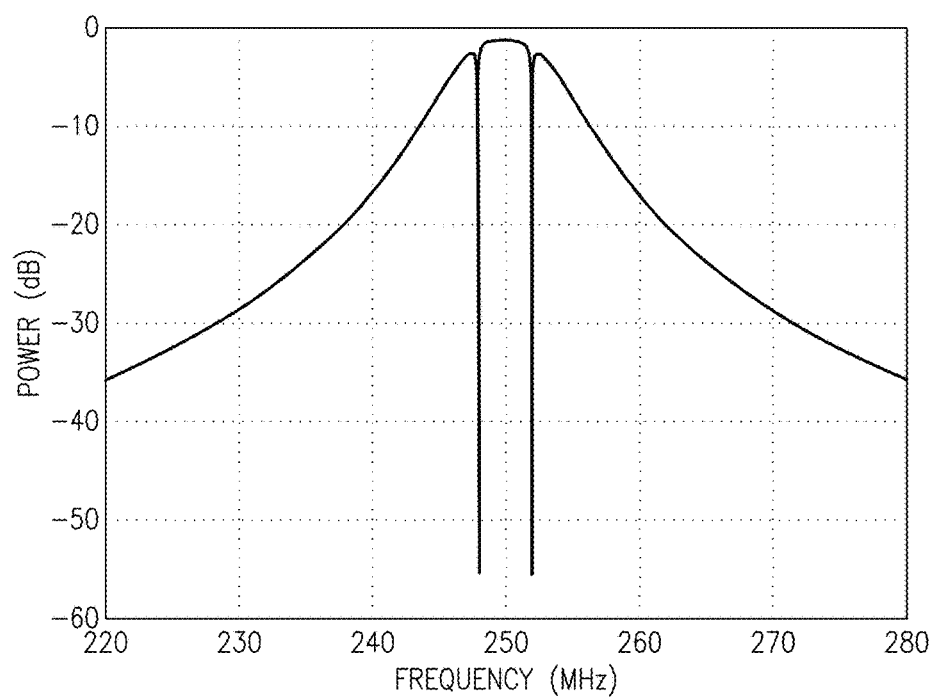
FIG. 6 is a graph of power versus frequency for one embodiment of a multipath bandpass filter with passband notches.

FIG. 6 is a graph of power versus frequency for one embodiment of a multipath bandpass filter with passband notches. The graph corresponds to one simulation of the multipath bandpass filter 130 of FIG. 4B in which N=4, in which the low pass filters 101-104 are implemented as second-order Butterworth Sallen-Key low pass filters, and in which the notch filters 111-114 are the same as one another.

As shown in FIG. 6, in-band notches are present in the passband of the multipath bandpass filter. Providing a bandpass filter with passband notches can provide a number of advantages. For example, a bandpass filter with passband notches can be used to attenuate out-of-band frequencies and certain in-band frequency channels while passing other frequency channels of the band. For instance, in wideband and ultra-wideband transceiver architectures, a bandpass filter with passband notches can be used to remove in-band blockers and/or to support aggregation by allowing a receiver to remove specific frequency channels.

Figure 7:
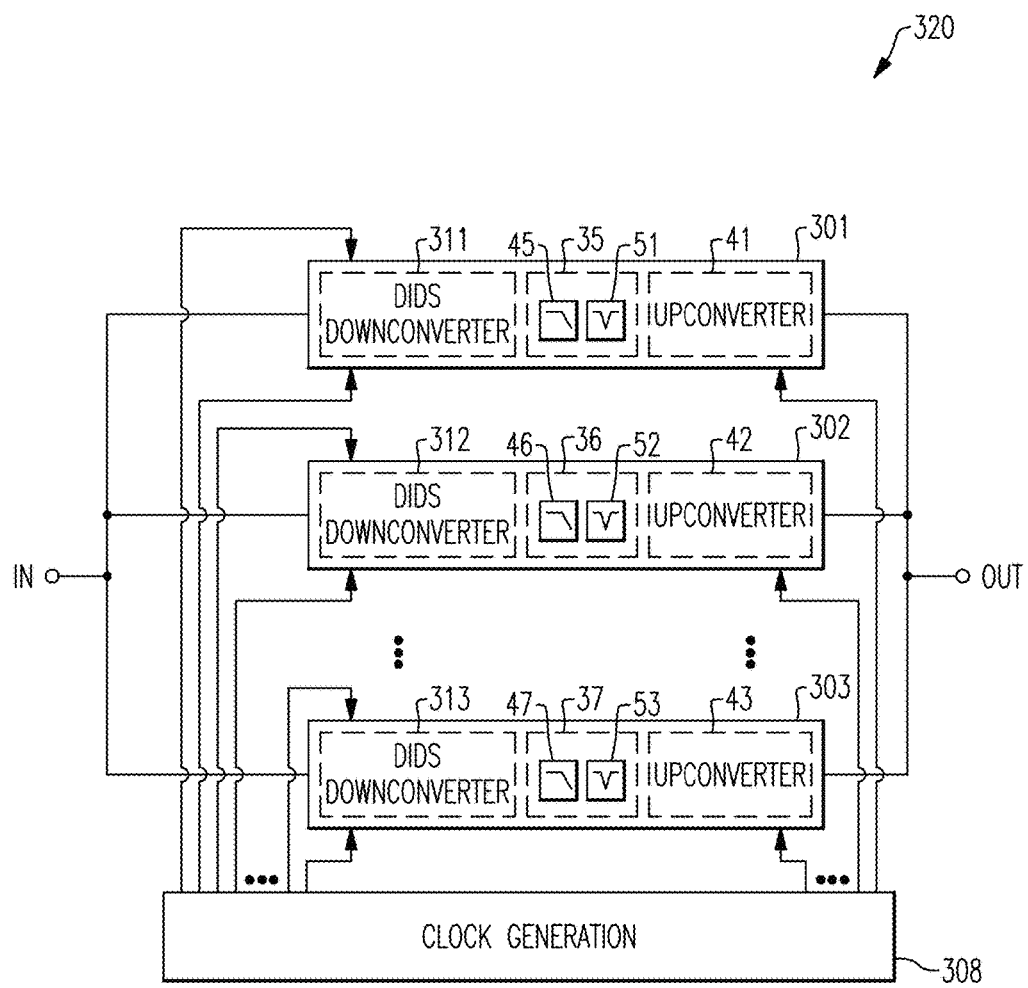
FIG. 7 is a schematic diagram of one embodiment of a multipath bandpass filter with passband notches and double-in double-switched (DIDS) downconverters.

FIG. 7 is a schematic diagram of one embodiment of a multipath bandpass filter 320 with passband notches and double-in double-switched (DIDS) downconverters. The multipath bandpass filter 320 includes a first filter circuit branch 301, a second filter circuit branch 302, a third filter circuit branch 303, and a clock generation circuit 308. As shown in FIG. 7, the filter circuit branches 301-303 are electrically connected in parallel with one another between an input terminal IN and an output terminal OUT.

Although an implementation of a multipath bandpass filter using three filter circuit branches is shown, the teachings herein are applicable to implementations using other numbers of filter circuit branches. In one embodiment, a multipath bandpass filter with passband notches and DIDS downconverters includes an even number of at least 4 filter circuit branches.

As shown in FIG. 7, each of the filter circuit branches 301-303 includes a DIDS downconverter, a filter network, and an upconverter. For example, the first filter circuit branch 301 includes a first DIDS downconverter 311, a first filter network 35, and a first upconverter 41. Additionally, the second filter circuit branch 302 includes a second DIDS downconverter 312, a second filter network 36, and a second upconverter 42. Furthermore, the third filter circuit branch 303 includes a third DIDS downconverter 313, a third filter network 37, and a third upconverter 43.

Each of the DIDS downconverters 311-313 provides downconversion using a pair of clock signals of about the same frequency ($f_{CLK}$), but different phases. For example, the clock generation circuit 308 generates a first pair of downconversion clock signals for the DIDS downconverter 311, a second pair of downconversion clock signals for the second DIDS downconverter 312, and a third pair of downconversion clock signals for the third DIDS downconverter 313. The downconversion clock signals are of different phases, such that the time instances at which the DIDS downconverters 311-313 downconvert the input signal are staggered in time.

In one embodiment, a multipath bandpass filter with DIDS downconverters includes N filter circuit branches, and a filter circuit branch k of the N filter circuit branches includes a DIDS downconverter that operates with a first clock signal having a phase of about 360°(k−1)/N and a second clock having a phase of about 360°(k+1)/N.

The upconverters 41-43 can also operate with a clock signal frequency of about $f_{CLK}$, but with different phases from one another. The clock phase of a given upconverter is offset in phase from the clock signal phases of a corresponding DIDS converter. Implementing a filter circuit branch in this manner aids in providing sufficient time for the node voltages of the filter circuit branch to settle (for instance, to provide sufficient time for capacitors to charge or discharge). In one embodiment, a multipath bandpass filter with DIDS downconverters includes N filter circuit branches, and a filter circuit branch k of the N filter circuit branches includes an upconverter that operates with a phase of about 360°(k/N).

The multipath bandpass filter 320 operates with superior even harmonic suppression performance.

For example, using the DIDS downconverters 311-313 reduces or eliminates even order harmonics, thereby significantly improving the performance of the filter. The even order harmonic suppression is achieved with lower cost and/or higher performance relative to a fully differential implementation. Thus, the performance with respect to suppressing even harmonics is superior when each filter circuit branch includes a DIDS downconverter relative to when each filter circuit branch includes a single-switched downconverter.

The multipath bandpass filter 320 also provides a desired center frequency ($f_{CENTER}$) using a relatively slow clock signal frequency ($f_{CLK}$) for upconversion and downconversion. For example, in certain implementations, $f_{CENTER}$ is about equal to $(N/2)f_{CLK}$. In such implementations, to achieve a desired center frequency $f_{CENTER}$, the clock signal frequency $f_{CLK}$ is selected to be about equal to $(2/N)f_{CENTER}$.

Lowering a frequency of $f_{CLK}$ (relative to an implementation in which $f_{CLK}$ is about equal to $f_{CENTER}$) provides a number of advantages, including, for example, reduced complexity and/or cost of the clock generation circuit 308. For example, the clock generation circuit 308 can generate non-overlapping clock signals of about the same frequency but of different phases. By reducing clocking constraints, the multipath bandpass filter 320 can be cheaper, faster, and/or easier to manufacture.

In the illustrated embodiment, the multipath bandpass filter 320 also provides a desired center frequency ($f_{CENTER}$) using a relatively slow clock signal frequency ($f_{CLK}$) for upconversion and downconversion. For example, in certain implementations, $f_{CENTER}$ is about equal to $(N/2)f_{CLK}$.

Figure 8:
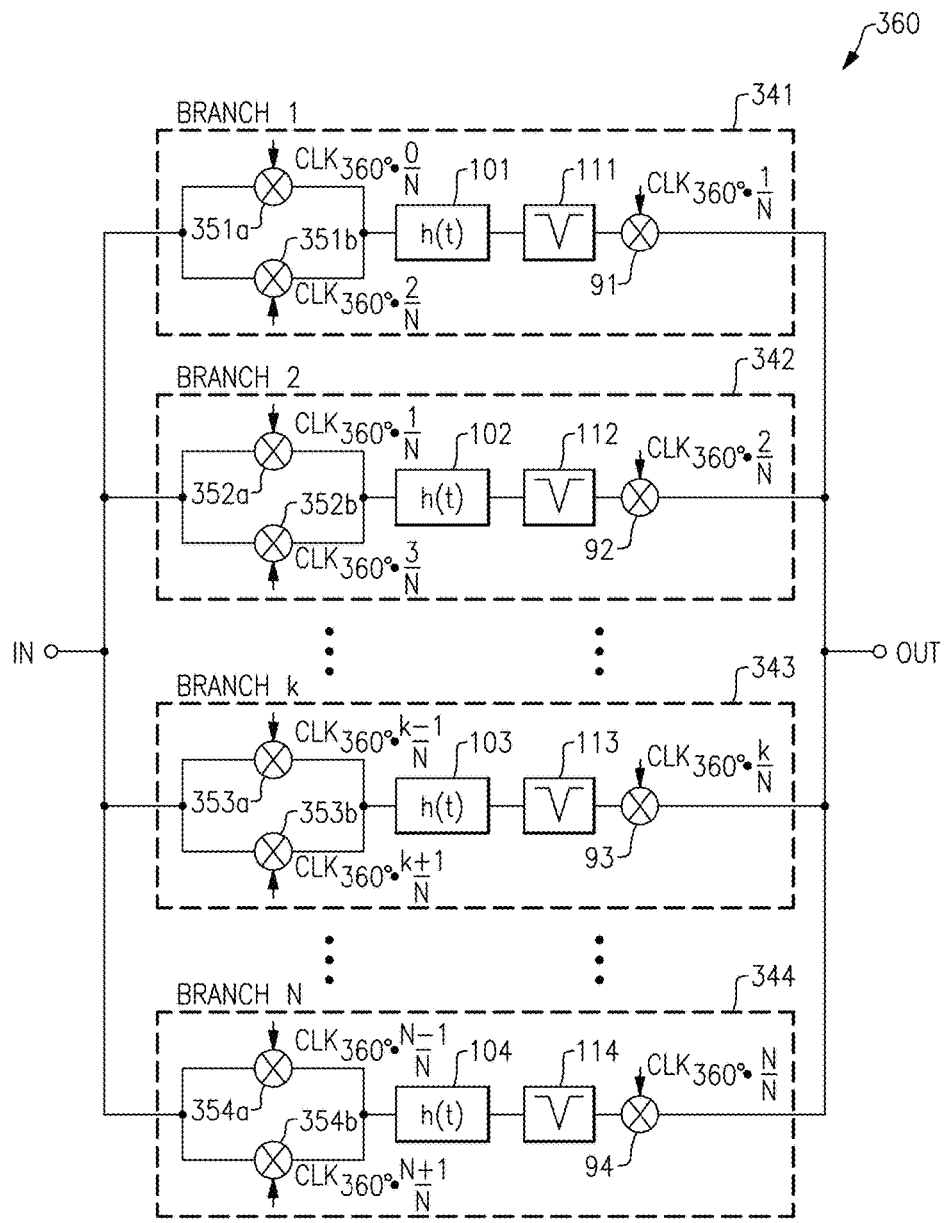
FIG. 8 is a schematic diagram of a multipath bandpass filter with passband notches and DIDS downconverters according to another embodiment.

FIG. 8 is a schematic diagram of another embodiment of a multipath bandpass filter 360 with passband notches and DIDS downconverters. The multipath bandpass filter 360 includes a first filter circuit branch 341, a second filter circuit branch 342, a kth filter circuit branch 343, and an Nth filter circuit branch 344. The filter circuit branches 341-344 are electrically connected in parallel with one another between the input terminal IN and the output terminal OUT.

The first filter circuit branch 341 includes a first DIDS downconverter implemented using a first downconverting mixer 351a and a second downconverting mixer 351b that are in parallel with one another and operate with clock signal phases 360°(0/N) and 360°(2/N), respectively. The first filter circuit branch 341 further includes a low pass filter 301 with transfer function h(t), a notch filter 111, and an upconverting mixer 91 that operates with clock signal phase 360°(1/N).

With continuing reference to FIG. 8, the second filter circuit branch 342 includes a second DIDS downconverter implemented using a first downconverting mixer 352a and a second downconverting mixer 352b that are in parallel with one another and operate with clock signal phases 360°(1/N) and 360°(3/N), respectively. The second filter circuit branch 342 further includes a low pass filter 102 with transfer function h(t), a notch filter 112, and an upconverting mixer 92 that operates with clock signal phase 360°(2/N).

The kth filter circuit branch 343 further includes a kth DIDS downconverter implemented using a first downconverting mixer 353a and a second downconverting mixer 353b that are in parallel with one another and operate with clock signal phases 360°(k−1)/N and 360°(k+1)/N, respectively. The kth filter circuit branch 343 further includes a low pass filter 103 with transfer function h(t), a notch filter 113, and an upconverting mixer 93 that operates with clock signal phase 360°(k/N).

With continuing reference to FIG. 8, the Nth filter circuit branch 344 further includes an Nth DIDS downconverter implemented using a first downconverting mixer 354a and a second downconverting mixer 354b that are in parallel with one another and operate with clock signal phases 360°(N−1)/N and 360°(N+1)/N, respectively. The Nth filter circuit branch 344 further includes a low pass filter 104 with transfer function h(t), a notch filter 114, and an upconverting mixer 94 that operates with clock signal phase 360°(N/N).

In this embodiment, each upconverting mixer operates with a clock signal phase that is about half way between the pair of clock signal phases of a corresponding DIDS downconverter. Additionally, each DIDS downconverter operates with a pair of clock signals that are about 720°/N apart in phase.

Although FIGS. 7 and 8 illustrate two examples of multipath bandpass filters that include filter circuit branches with DIDS downconverters, any of the multipath bandpass filters described herein can be implemented with DIDS downconverters.

Examples of RF Systems, Modules, and Devices Implemented with One or More Multipath Bandpass Filters Multipath bandpass filters can be implemented in a wide range of RF systems, modules, and devices. Although various examples of such RF systems, modules, and devices are described, the teachings herein are applicable to a wide range of electronics.

Figure 9A:
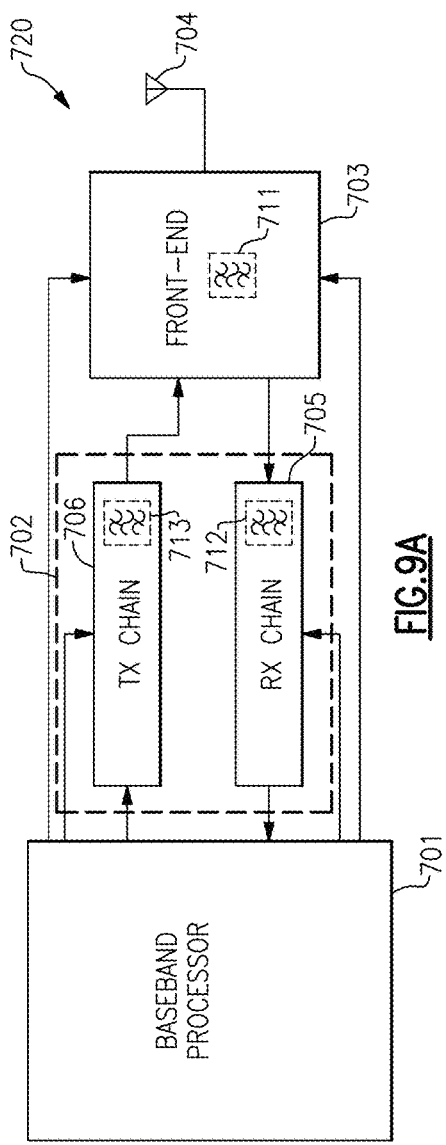
FIG. 9A is a schematic diagram of one embodiment of a radio frequency system.

FIG. 9A is a schematic diagram of one embodiment of an RF system 720. The RF system 720 includes baseband processor 701, a transceiver 702, a front-end 703, and an antenna 704. The transceiver 702 includes a receiver chain 705 and a transmitter chain 706.

As shown in FIG. 9A, various circuitry of the RF system 720 can include one or more multipath bandpass filters implemented in accordance with the teachings herein. For example, in the illustrated embodiment, the front-end 703 includes one or more multipath bandpass filters 711, the receive chain 705 includes one or more multipath bandpass filters 712, and/or the transmit chain 706 includes one or more multipath bandpass filters 713. Although an example configuration of multipath bandpass filters is shown, an RF system can include multipath bandpass filters implemented in a wide variety of ways.

Figure 9B:
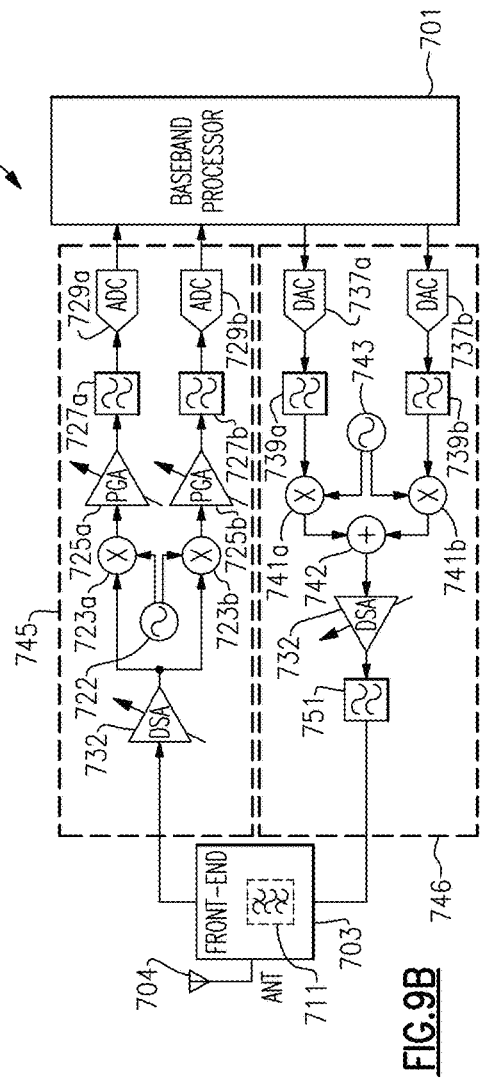
FIG. 9B is a schematic diagram of another embodiment of a radio frequency system.

FIG. 9B is a schematic diagram of another embodiment of an RF system 730. The RF system 730 includes a baseband processor 701, a receive circuit 745, a transmit circuit 746, a front-end system 703, and an antenna 704. The RF system 730 illustrates one example implementation of radio frequency circuitry suitable for operation in a mobile device or base station. However, mobile devices and base stations can be implemented in a wide variety of ways.

The RF system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit circuit 746 and the receive circuit 745 can be used for transmitting and receiving signals over the antenna 704. Although one implementation of the RF system 730 is illustrated in FIG. 9B, the RF system 730 can be modified in any suitable manner. For example, the RF system 730 can be modified to include additional transmit circuits, receive circuits, front-ends, and/or antennas.

In the illustrated configuration, the receive circuit 745 includes a digital step attenuator (DSA) 732, a local oscillator 722, a first mixer 723a, a second mixer 723b, a first programmable gain amplifier (PGA) 725a, a second PGA 725b, a first filter 727a, a second filter 727b, a first analog-to-digital converter (ADC) 729a, and a second ADC 729b. Although one implementation of a receive circuit is illustrated in FIG. 9B, a receive circuit can include more or fewer components and/or a different arrangement of components.

An RF signal can be received on the antenna 704 and provided to the receive circuit 745 using the front-end system 703. For example, the front-end system 703 can be controlled to electrically couple the antenna 704 to an input of the DSA 732. In the illustrated embodiment, an amount of attenuation provided by the DSA 732 is digitally-controllable, and can be set to achieve a desired signal power level.

The first and second mixers 723a, 723b receive first and second local oscillator clock signals, respectively, from the local oscillator 722. The first and second local oscillator clock signals can have about the same frequency and a phase difference equal to about a quarter of a period, or about 90°. The first and second mixers 723a, 723b downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725a, 725b, respectively. To aid in reducing output noise, the outputs of the first and second programmable gain amplifiers 725a, 725b can be filtered using the first and second filters 727a, 727b, which can be any suitable filter, including, for example, low pass, band pass, or high pass filters. The outputs of the first and second filters 727a, 727b can be provided to the first and second ADCs 729a, 729b, respectively. The first and second ADCs 729a, 729b can have any suitable resolution. In the illustrated configuration, the outputs of the first and second ADCs 729a, 729b are provided to the baseband processor 701 for processing.

The baseband processor 701 can be implemented in a variety of ways. For instance, the baseband processor 701 can include a digital signal processor, a microprocessor, a programmable core, the like, or any combination thereof. Moreover, in some implementations, two or more baseband processors can be included in the RF system 730.

As shown in FIG. 9B, the transmit circuit 746 receives data from the baseband processor 701 and is used to transmit RF signals via the antenna 704. The transmit circuit 746 and the receive circuit 745 both operate using the antenna 704, and access to the antenna 704 is controlled using the front-end system 703. The illustrated transmit circuit 746 includes first and second digital-to-analog converters (DACs) 737a, 737b, first and second filters 739a, 739b, first and second mixers 741a, 741b, a local oscillator 743, a combiner 742, a DSA 732, and an output filter 751. Although one implementation of a transmit circuit is illustrated in FIG. 9B, a transmit circuit can include more or fewer components and/or a different arrangement of components.

The baseband processor 701 can output a digital in-phase (I) signal and a digital quadrature-phase (Q) signal, which can be separately processed until they are combined using the combiner 742. The first DAC 737a converts the digital I signal into an analog I signal, and the second DAC 737b converts the digital Q signal into an analog Q signal. The first and second DACs 737a, 737b can have any suitable precision. The analog I signal and the analog Q signal can be filtered using the first and second filters 739a, 739b, respectively. The outputs of the first and second filters 739a, 739b can be upconverted using the first and second mixers 741a, 741b, respectively. For example, the first mixer 741a is used to upconvert the output of the first filter 739a based on an oscillation frequency of the local oscillator 743, and the second mixer 741b is used to upconvert the output of the second filter 739b based on the oscillation frequency of the local oscillator 743.

The combiner 742 combines the outputs of the first and second mixers 741a, 741b to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 is provided to the antenna 704 through the front-end system 703, which can include a power amplifier.

The illustrated RF system 730 can include one or more multipath bandpass filters implemented using one or more features discloses herein. For example, the RF front-end system 703, the receive circuit 745, and/or the transmit circuit 746 can include one or more multipath bandpass filters with passband notches.

Although FIG. 9B illustrates one example of an RF system that can include a front-end system implemented in accordance with the teachings herein, the front-end systems herein can be used in other configurations of electronics.

Figure 10:
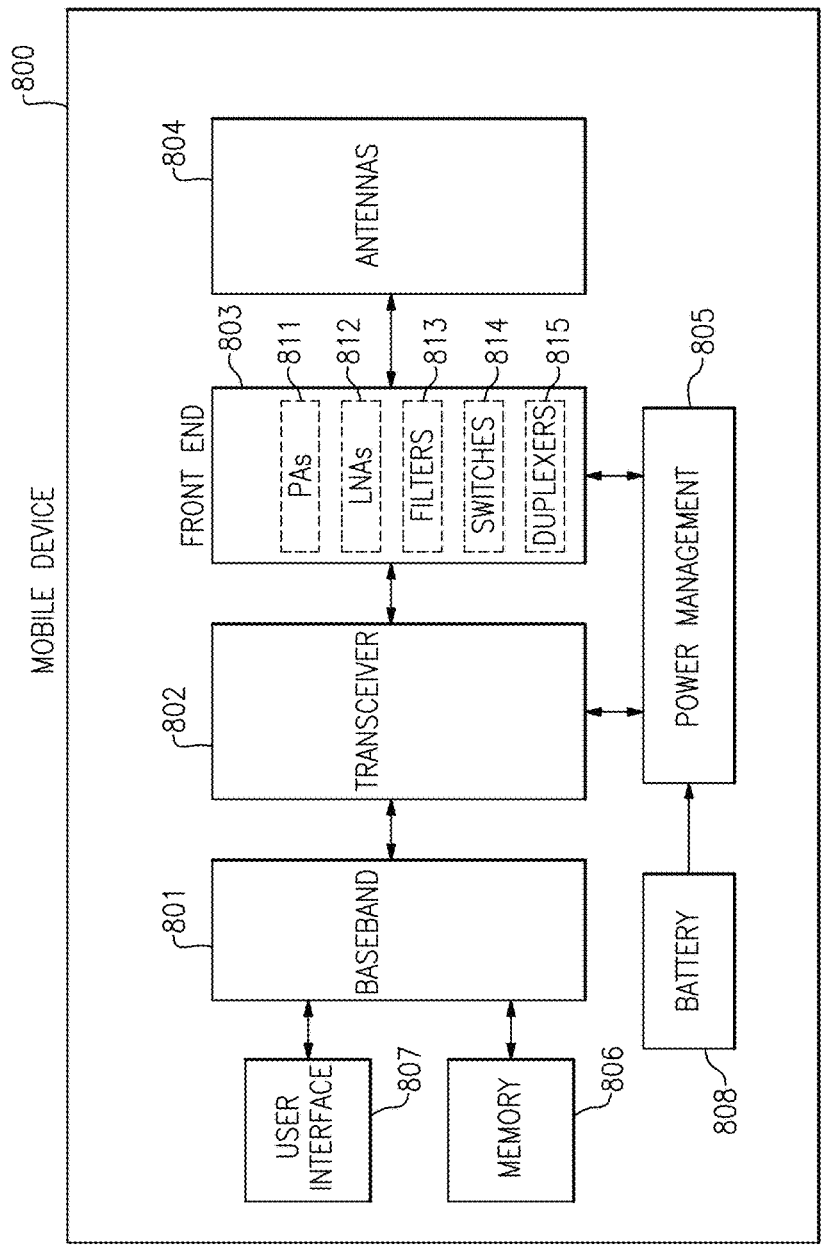
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The filters 813 of the front end system 803 can include one or more multipath bandpass filters implemented in accordance with the teachings herein.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11A:
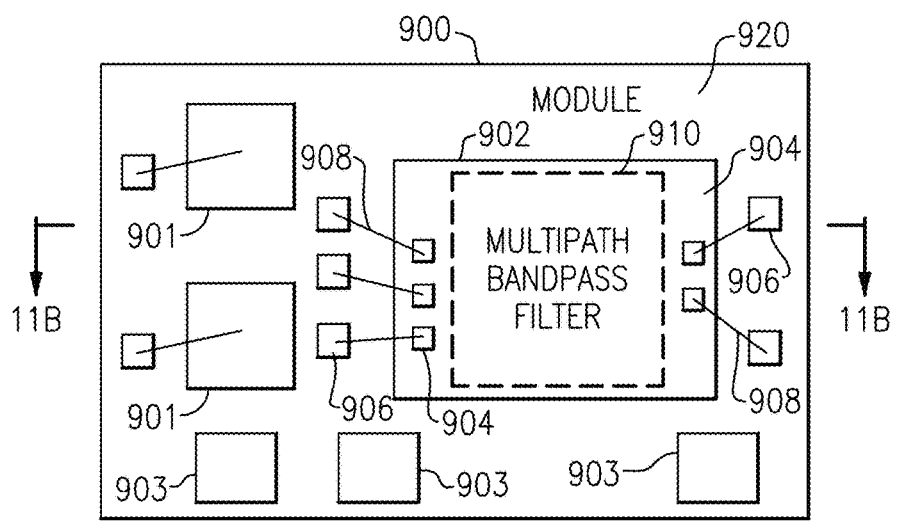
FIG. 11A is a schematic diagram of one embodiment of a packaged module.
Figure 11B:
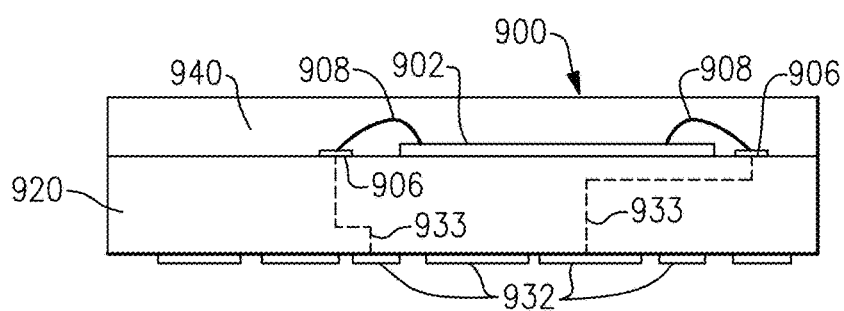
FIG. 11B is a schematic diagram of a cross-section of the packaged module of FIG. 11A taken along the lines 11B-11B.

FIG. 11A is a schematic diagram of one embodiment of a packaged module 900. FIG. 11B is a schematic diagram of a cross-section of the packaged module 900 of FIG. 11A taken along the lines 11B-11B.

The packaged module 900 includes radio frequency components 901, a semiconductor die 902, surface mount devices 903, wirebonds 908, a package substrate 920, and encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes at least one multipath bandpass filter 910 implemented in accordance with the teachings herein. In certain implementations, the packaged module 900 corresponds to a front-end module (FEM).

Although the packaged module 900 illustrates one example of a module implemented in accordance with the teachings herein, other implementations are possible.

As shown in FIG. 11B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a wireless device. The example contact pads 932 can be configured to provide radio frequency signals, bias signals, and/or power (for example, a power supply voltage and ground) to the semiconductor die 902. As shown in FIG. 11B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Multipath bandpass filters with passband notches can be included in various electronic devices, including, but not limited to consumer electronic products, parts of the consumer electronic products, electronic test equipment, etc. Examples of the electronic devices can also include, but are not limited to, circuits of communication networks. The consumer electronic products can include, but are not limited to, a mobile phone, a tablet, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multipath bandpass filter comprising:
    an input terminal configured to receive an input signal;
    an output terminal; and
    a plurality of filter circuit branches electrically connected in parallel between the input terminal and the output terminal, each of the filter circuit branches including a downconverter configured to generate a downconverted signal by downconverting the input signal, a filter network including at least one low pass filter and at least one notch filter configured to filter the downconverted signal to generate a filtered signal, and an upconverter configured to upconvert the filtered signal to generate an upconverted filtered signal, each upconverter having a respective output connected to the output terminal such that each respective upconverted filtered signal is combined at the output terminal to thereby generate a bandpass signal with passband notches, the downconverter configured to receive a first clock signal phase and the upconverter configured to receive a second clock signal phase that is offset from the first clock signal phase.

2. The multipath bandpass filter of claim 1 wherein a plurality of time instances at which the plurality of filter circuit branches downconvert the input signal are staggered in time.

3. The multipath bandpass filter of claim 1 further comprising a clock generation circuit configured to control timing of the plurality of filter circuit branches based on a common clock signal frequency, the multipath bandpass filter having a center frequency about equal to the common clock signal frequency.

4. The multipath bandpass filter of claim 1 wherein the at least one notch filter is configurable to control a location in frequency of the passband notches.

5. The multipath bandpass filter of claim 1 wherein the plurality of filter circuit branches are an integer N in number, the first clock signal phase and the second clock signal phase separated in phase by about 360°/N.

6. The multipath bandpass filter of claim 1 wherein the plurality of filter circuit branches includes at least four filter circuit branches.

7. A multipath bandpass filter comprising:
    an input terminal configured to receive an input signal;
    an output terminal; and
    a plurality of filter circuit branches electrically connected in parallel between the input terminal and the output terminal, each of the filter circuit branches including a downconverter configured to generate a downconverted signal by downconverting the input signal, a filter network including at least one low pass filter and at least one notch filter configured to filter the downconverted signal to generate a filtered signal, and an upconverter configured to upconvert the filtered signal to generate an upconverted filtered signal, each upconverter having a respective output connected to the output terminal such that each respective upconverted filtered signal is combined at the output terminal to thereby generate a bandpass signal with passband notches, the downconverter being a double-in double-switched downconverter configured to downconvert the input signal with a pair of clock signals of a common clock signal frequency but of different phases.

8. The multipath bandpass filter of claim 7 wherein the multipath bandpass filter has a center frequency about equal to one-half of a product of a number of the plurality of filter circuit branches and the common clock signal frequency.

9. The multipath bandpass filter of claim 7 wherein a plurality of time instances at which the plurality of filter circuit branches downconvert the input signal are staggered in time.

10. A packaged module comprising:
a package substrate; and
a semiconductor die attached to the package substrate, the semiconductor die having a plurality of circuit branches formed therein, the plurality of circuit branches electrically connected in parallel between an input node that receives an input signal and an output node, each of the plurality of filter circuit branches including a downconverter configured to generate a downconverted signal by downconverting the input signal, a filter network including at least one low pass filter and at least one notch filter configured to filter the downconverted signal to generate a filtered signal, and an upconverter configured to upconvert the filtered signal to generate an upconverted filtered signal, each upconverter having a respective output connected to the output node such that each respective upconverted filtered signal is combined at the output node to thereby generate a bandpass signal with passband notches, the semiconductor die further including a clock generation circuit configured to control the plurality of filter circuit branches with a plurality of clock signal phases of a common clock signal frequency but of different phases, the multipath bandpass filter having a center frequency about equal to the common clock signal frequency.

11. The packaged module of claim 10 wherein a plurality of time instances at which the plurality of filter circuit branches downconvert the input signal are staggered in time.

12. The packaged module of claim 10 wherein the at least one notch filter is configurable to control a location in frequency of the passband notches.

13. The packaged module of claim 10 wherein the downconverter and the upconverter of each of the plurality of filter circuit branches operate with a phase offset.

14. The packaged module of claim 10 wherein the downconverter is a double-in double-switched downconverter.

15. The packaged module of claim 10 wherein the plurality of filter circuit branches includes at least four filter circuit branches.

16. A mobile device comprising:
an antenna; and
a front-end module electrically coupled to the antenna, the front-end module including an input terminal configured to receive an input signal from the antenna, an output terminal configured to provide a bandpass filtered signal with notches, and a plurality of filter circuit branches electrically connected in parallel between the input terminal and the output terminal, each of the plurality of filter circuit branches including a downconverter configured to generate a downconverted signal by downconverting the input signal, a filter network including at least one low pass filter and at least one notch filter configured to filter the downconverted signal to generate a filtered signal, and an upconverter configured to upconvert the filtered signal to generate an upconverted filtered signal, each upconverter having a respective output connected to the output terminal such that each respective upconverted filtered signal is combined at the output terminal to thereby generate a bandpass signal with passband notches, the plurality of filter circuit branches configured to downconvert the input signal at a plurality of time instances that are staggered in time.

17. The mobile device of claim 16 wherein the filter network is configurable to control a frequency response of the multipath bandpass filter.

18. The mobile device of claim 16 wherein the at least one notch filter is configurable to control a location in frequency of the passband notches.

19. The mobile device of claim 16 wherein the downconverter is configured to receive a first clock signal phase and the upconverter is configured to receive a second clock signal phase that is offset from the first clock signal phase.

20. The mobile device of claim 16 wherein the plurality of filter circuit branches includes at least four filter circuit branches.

* * * * *